(12) United States Patent
Hosokawa

(10) Patent No.: US 6,185,721 B1
(45) Date of Patent: Feb. 6, 2001

(54) METHOD OF DESIGN FOR TESTABILITY AT RTL AND INTEGRATED CIRCUIT DESIGNED BY THE SAME

(75) Inventor: Toshinori Hosokawa, Osaka (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 08/810,585

(22) Filed: Mar. 4, 1997

(30) Foreign Application Priority Data

Mar. 6, 1996 (JP) .................................... 8-048599
Aug. 26, 1996 (JP) .................................... 8-223551

(51) Int. Cl.$^7$ .................................................. G06F 17/50
(52) U.S. Cl. ............................................................ 716/5
(58) Field of Search .................................. 364/488, 489, 364/490, 491; 716/5, 18

(56) References Cited

U.S. PATENT DOCUMENTS 5,541,849 * 7/1996 Roatoker et al. ..................... 364/489
6,002,861 * 12/1999 Butts ........................................ 716/5

FOREIGN PATENT DOCUMENTS 4-015580  1/1992 (JP) .
4-074274  3/1992 (JP) .

OTHER PUBLICATIONS

Akira Motohara et al., "Design For Testability Using Register-Transfer Level Partial Scan Selection", Asia South Pacific Desigb Automation Conference 1995, pp. 209–215, Aug. 29, 1995.

Y. Kobayashi et al., "A Study on Testable VLSI Design", 1990 Spring National Convention Record, The Institute of Electronics, Information and Communication Engineers (EIECE), Part 5, pp. 5–199, Mar. 18–21, 1990.

K. Muroi et al., "MULTES/IS: Automatic Test Generation System in Incomplete Scan Method (2) Design rule Check and Circuit Partitioning" Transaction of Information Processing Society of Japan, 35th (1987 latter term) National Convention, pp. 2197–2198, Sep. 28–30, 1987.

* cited by examiner

Primary Examiner—Paul R. Lintz
Assistant Examiner—Thuan Do
(74) Attorney, Agent, or Firm—McDermott, Will & Emery

(57) ABSTRACT

The invention provides a method of design for testability in which design of an integrated circuit is modified, at a register transfer level (RTL) with high abstraction than the gate level, so as to be simply testable and in which the area of a test circuit and the number of test patterns can be decreased as compared with those in the conventional method. An integrated circuit which has been designed in an RTL design step is partitioned into blocks each satisfying a previously defined simply testable condition in a partitioning step, so that the integrated circuit can be simply tested after manufacture. The simply testable condition can be that a circuit has an acyclic structure including no feedback loop, that a circuit has an n-fold line-up structure (wherein n is a positive integer), or the like. In the integrated circuit having been partitioned into the blocks in the partitioning step, the design is modified by using multiplexers, isolation controllers and the like in an isolation step so that the respective blocks can be independently tested.

23 Claims, 34 Drawing Sheets

Maximum value of the exceeding time:3
Input number of LSI:24
Output number of LSI:16
Simply testable condition:No loop(acyclic structure)

Block 10A

| | Input number | Output number | Facility in block |
|---|---|---|---|
| ① | 8 | 8 | 101 |
| ② | 16 | 8 | 101, 106 |
| ③ | 16 | 8 | 101, 106, 113 |
| ④ | 16 | 8 | 101, 106, 113, 107 |

Block 10B

| | Input number | Output number | Facility in block |
|---|---|---|---|
| ① | 16 | 8 | 114 |
| ② | 16 | 16 | 114, 108 |
| ③ | 16 | 16 | 114, 108, 104 |
| ④ | 16 | 16 | 114, 108, 104, 109 |
| ⑤ | 16 | 24 | 114, 108, 104, 109, 116 |
| ⑥ | 16 | 24 | 114, 108, 104, 109, 116, 102 |
| ⑦ | 24 | 32 | 114, 108, 104, 109, 116, 102, 110 |

Remove facilities 116, 102, 110

Block 10C

| | Input number | Output number | Facility in block |
|---|---|---|---|
| ① | 8 | 8 | 102 |
| ② | 8 | 8 | 102, 116 |
| ③ | 16 | 24 | 102, 116, 110 |
| ④ | 16 | 24 | 102, 116, 110, 115 |
| ⑤ | 16 | 16 | 102, 116, 110, 115, 111 |
| ⑥ | 16 | 16 | 102, 116, 110, 115, 111, 105 |
| ⑦ | 16 | 16 | 102, 116, 110, 115, 111, 105, 117 |
| ⑧ | 16 | 16 | 102, 116, 110, 115, 111, 105, 117, 112 |
| ⑨ | 16 | 16 | 102, 116, 110, 115, 111, 105, 117, 112, 103 |

Maximum value of the exceeding time:2
Input number of LSI:24
Output number of LSI:16
Simply testable condition:No loop(acyclic structure)

FIG. 14

Block 20A

| | Input number | Output number | Facility in block |
|---|---|---|---|
| ① | 8 | 8 | 201 |
| ② | 16 | 8 | 201, 206 |
| ③ | 8 | 16 | 201, 206, 212 |
| ④ | 16 | 16 | 201, 206, 212, 207 |
| ⑤ | 8 | 16 | 201, 206, 212, 207, 213 |
| ⑥ | 8 | 16 | 201, 206, 212, 207, 213, 208 |
| ⑦ | 8 | 16 | 201, 206, 212, 207, 213, 208 |
| ⑧ | 16 | 24 | 201, 206, 212, 207, 213, 208, 209 |
| ⑨ | 16 | 24 | 201, 206, 212, 207, 213, 208, 209. 214 |

Remove facilities 209, 214 (at ⑥, ⑦)

Block 20B

| | Input number | Output number | Facility in block |
|---|---|---|---|
| ① | 16 | 16 | 209 |
| ② | 16 | 16 | 209, 214 |
| ③ | 16 | 8 | 209, 214, 210 |
| ④ | 16 | 8 | 209, 214, 210, 215 |
| ⑤ | 16 | 8 | 209, 214, 210, 215, 205 |
| ⑥ | 16 | 16 | 209, 214, 210, 215, 205, 202 |
| ⑦ | 16 | 16 | 209, 214, 210, 215, 205, 202, 216 |
| ⑧ | 24 | 16 | 209, 214, 210, 215, 205, 202, 216, 211 |
| ⑨ | 24 | 8 | 209, 214, 210, 215, 205, 202, 216, 211, 217 |
| ⑩ | 24 | 8 | 209, 214, 210, 215, 205, 202, 216, 211, 217, 203 |

Maximum value of the exceeding time:0
Input number of LSI:24
Output number of LSI:16
Simply testable condition:No loop(acyclic structure)

FIG. 17

Block 30A

| | Input number | Output number | Facility in block |
|---|---|---|---|
| ① | 8 | 8 | 201 |
| ② | 16 | 8 | 201, 206 |
| ③ | 24 | 16 | 201, 206, 204 |
| ④ | 24 | 16 | 201, 206, 204, 208 |

Block 30B

| | | | |
|---|---|---|---|
| ① | 8 | 8 | 212 |
| ② | 16 | 16 | 212, 207 |

Block 30C

| | | | |
|---|---|---|---|
| ① | 16 | 8 | 213 |
| ② | 16 | 16 | 213, 217 |

Block 30D

| | | | |
|---|---|---|---|
| ① | 16 | 16 | 209 |
| ② | 16 | 16 | 209, 214 |
| ③ | 24 | 8 | 209, 214, 210 |
| ④ | 24 | 8 | 209, 214, 210, 215 |
| ⑤ | 24 | 8 | 209, 214, 210, 215, 205 |
| ⑥ | 24 | 16 | 209, 214, 210, 215, 205, 202 |
| ⑦ | 24 | 16 | 209, 214, 210, 215, 205, 202, 216 |

Block 30E

| | | | |
|---|---|---|---|
| ① | 24 | 8 | 211 |
| ② | 24 | 8 | 211, 203 |

| Input \ Output | $O_1$ | $O_2$ | $O_3$ |
|---|---|---|---|
| A | ○ | × | × |
| B | ○ | ○ | × |
| C | × | ○ | ○ |
| D | × | × | ○ |

| Input \ Output | $O_1$ | $O_2$ | $O_3$ |
|---|---|---|---|
| A, C | ○ | ○ | ○ |
| B, D | ○ | ○ | ○ |

METHOD OF DESIGN FOR TESTABILITY AT RTL AND INTEGRATED CIRCUIT DESIGNED BY THE SAME

BACKGROUND OF THE INVENTION

The present invention relates to a method of design for testability for integrated circuits (LSIs).

A typical example of the conventional method of design for testability includes a scan path method. In the scan path method, a flip-flop (FF) included in a logically designed LSI is replaced with a scan FF which can be externally directly controlled (scanned in) and observed (scanned out), so that a problem of a sequential circuit can be simplified into a problem of a combinational circuit. Thus, a test sequence can be easily generated ("Digital Systems Testing and Testable DESIGN, Chapter 9, Design For Testability", 1990, published by Computer Science Press).

However, such a conventional method of design for testability has the following problems:

(1) Since an FF is replaced with a scan FF, the LSI is increased in area.

(2) Since a test input pattern for the scan-in/out operation on a scan chain is required, the number of test input patterns is increased, resulting in increasing time required for the test of the LSI.

(3) Since an FF is replaced with a scan FF after logical design, it is necessary to examine the operation timing of the LSI again. According to circumstances, the LSI is required to be logically designed again, namely, so-called the re-design of the LSI is required. This elongates time for designing the LSI.

SUMMARY OF THE INVENTION

The object of the invention is providing a method of design for testability in which an integrated circuit is modified in design at a register transfer level (RTL; i.e., a level of functional design) with high abstraction than a gate level (i.e., a level of logical design), so as to be simply testable, and in which an area of a test circuit and the number of test patterns can be decreased as compared with those in the conventional method.

Specifically, the method of design for testability at a register transfer level of this invention comprises a partitioning step for partitioning an RTL circuit, which is an integrated circuit designed at the register transfer level, into blocks each satisfying a previously defined simply testable condition, thereby simplifying a test conducted after manufacture.

Furthermore, the method of design for testability at a register transfer level of this invention further comprises an isolation step for modifying design of the RTL circuit, which has been partitioned into the blocks each satisfying the simply testable condition, thereby making the blocks independently testable.

Accordingly, the RTL circuit is first partitioned into the blocks each satisfying the simply testable condition in the partitioning step, and then in the isolation step, the design is modified so that the respective blocks can be independently singly tested. As a result, the RTL circuit can be tested in each of the blocks with a difficulty in generating a test sequence substantially the same as that of the scan path method. Therefore, there is no need to replace an FF with a scan FF after the logical design. This can decrease the area of the LSI (RTL circuit) and the number of test sequences required for the test thereof as compared with those in the conventional method.

In addition, there is no need of re-design, and hence there is no need to conduct the logical design again because the test simplifying design is effected at the RTL, which can decrease time required for designing the LSI as compared with time required in the conventional method.

In one aspect, the simply testable condition is preferably that a circuit in the block has an acyclic structure including no feedback loop.

In another aspect, the simply testable condition is preferably that a circuit in the block has an n-fold line-up structure in which signal paths between an arbitrary register and an arbitrary external output or pseudo-external output have n sorts or less of sequential depths, wherein n is a positive integer.

In still another aspect, the partitioning step preferably includes a first process for selecting, among functional facilities included in the RTL circuit, one functional facility which belongs to none of the blocks, and for generating one block including the selected functional facility; a second process for selecting another functional facility, which is adjacent to the block generated in the first process and does not belong to any other blocks, and for inserting the selected functional facility into the generated block; and a third process for discriminating whether or not the generated block is simply testable in accordance with the previously defined simply testable condition, and when the generated block is discriminated to be not simply testable, for removing the functional facility inserted in the second process from the generated block.

In still another aspect, the partitioning step preferably further includes a fourth process for removing, from the generated block, the functional facility inserted into the generated block in the second process in a reverse order to an inserting order so as to make an input number of the generated block smaller than an input number of the RTL circuit and an output number of the generated block smaller than an output number of the RTL circuit In still another aspect, the partitioning step preferably includes a process for identifying a register having a self-loop and a finite state machine included in the RTL circuit as a scan register.

In still another aspect, the partitioning step preferably includes a process for obtaining relationship in reachableness between each input and each output of the block by extracting an input reachable to each output, and obtaining a plurality of inputs of the block whose value is controllable through a common external input pin of the RTL circuit on the basis of the relationship.

In still another aspect, the partitioning step preferably includes, when any of the functional facilities has a larger input number or larger output number than the RTL circuit, a process for converting the functional facility into an equivalent circuit including functional facilities each having a smaller input number and a smaller output number than the RTL circuit.

In still another aspect, the partitioning step preferably includes a process for collecting finite state machines included in the RTL circuit in a common block.

Furthermore, the isolation step preferably includes a first process for generating, in the RTL circuit which has been partitioned into the blocks each satisfying the simply testable condition, an input controlling multiplexer for making an input of each block externally directly controllable and an output observing multiplexer for making an output of each block externally directly observable; and a second process for generating, in the RTL circuit in which the input controlling multiplexer and the output observing multiplexer have been generated in the first process, an isolation controller including a finite state machine for controlling the output observing multiplexer for making the blocks successively testable and a decoder for decoding a content of a register included in the finite state machine.

In still another aspect, the partitioning step preferably further includes a process, in partitioning the RTL circuit into the blocks, for identifying a register having a self-loop included in the RTL circuit as a scan register, and the isolation step preferably further includes a third process for replacing the register having been identified as a scan register in the process of the partitioning step with a scan register and for forming scan chains by connecting the scan register in each of the blocks; and a fourth process for generating a multiplexer, using scan-out data of the scan chains formed in the third process as an input, for selecting and outputting one of scan-out data of the scan chains.

In still another aspect, the isolation step preferably includes a process for forming, in the RTL circuit having been partitioned into the blocks each satisfying the simply testable condition, a scan chain in each of the blocks, thereby making an input signal controllable and an output signal observable from the outside of the RTL circuit.

BRIEF DESCRIPTION OF THE DRAWINGS

FIGS. 4(a) and 4(b) illustrate the partitioning step in the method of design for testability at the RTL of the first embodiment, wherein FIG. 4(a) is a diagram of an RTL circuit to be partitioned and FIG. 4(b) is a diagram resulting from the partitioning step executed on the RTL circuit of FIG. 4(a);

FIGS. 13(a) and 13(b) illustrate the partitioning step of the method of design for testability at the RTL of the second embodiment, wherein FIG. 13(a) is a diagram of an RTL circuit to be partitioned and FIG. 13(b) is a diagram resulting from the partitioning step executed on the circuit of FIG. 13(a);

FIG. 14 is a diagram for showing information on respective blocks in the circuit of FIG. 12(b);

FIG. 17 is a diagram for showing information on respective blocks in the circuit of FIG. 16;

FIGS. 24(a) through 24(c) illustrate the process for merging the inputs of a block shown in FIG. 23, wherein FIG. 24(a) is a schematic diagram of the block, FIG. 24(b) is a table for showing a relationship between inputs and outputs in Teachableness, and FIG. 24(c) is a table obtained as a result of merging the inputs;

FIGS. 26(a) and 26(b) illustrate an isolation step in a method of design for testability at the RTL according to a seventh embodiment of the invention, wherein FIG. 26(a) is a diagram of a block where an external input enters a functional facility other than a register, and FIG. 26(b) is a diagram resulting from design modification for isolating the block of FIG. 26(a);

FIGS. 27(a) and 27(b) illustrate the isolation step in the method of design for testability at the RTL of the seventh embodiment, wherein FIG. 27(a) is a diagram of a block where an external output is output by a functional facility other than a register, and FIG. 27(b) is a diagram resulting from design modification for isolating the block of FIG. 27(a);

FIGS. 31(a) and 31(b) illustrate the preprocessing of the method of design for testability at the RTL of the eighth embodiment, wherein FIG. 31(a) is a diagram of a multiplexer having a larger input number than an LSI, and FIG. 31(b) is a diagram resulting from converting the multiplexer of FIG. 31(a) into an equivalent circuit through the preprocessing;

FIGS. 32(a) and 32(b) illustrate the preprocessing of the method of design for testability at the RTL of the eighth embodiment, wherein FIG. 32(a) is a diagram of an adder having a larger input number than an LSI, and FIG. 32(b) is a diagram resulting from converting the adder of FIG. 32(a) into an equivalent circuit through the preprocessing;

DETAILED DESCRIPTION OF THE INVENTION

Figure 1:
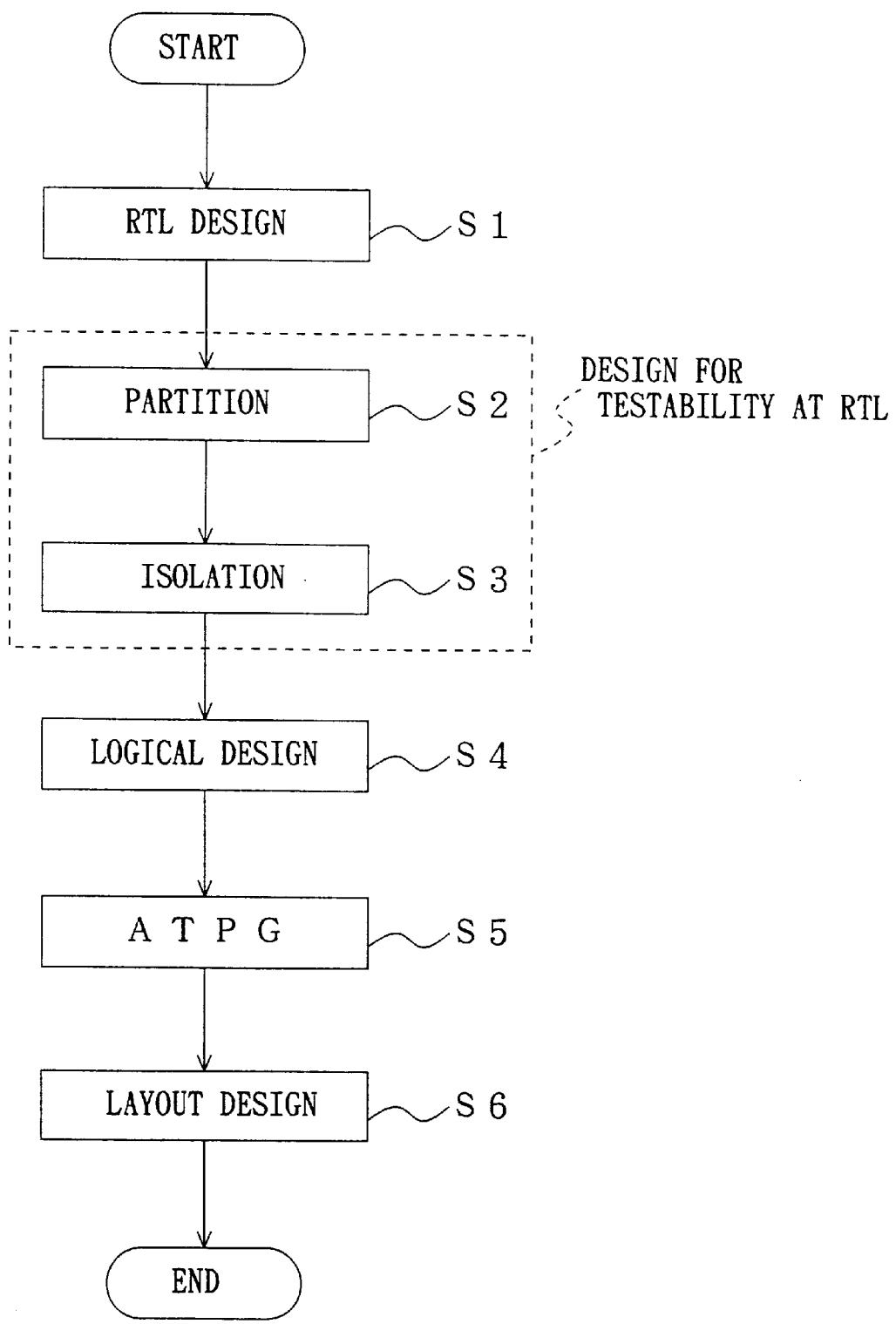
FIG. 1 is a flowchart for showing the location of the present method in design of an LSI.

FIG. 1 is a flowchart of fundamental procedures in LSI design for showing the location of a method of design for testability of the invention therein. As is shown in FIG. 1, the present method of design for testability is executed in test simplifying design at a register transfer level (RTL), and includes a partitioning step S2 for partitioning an RTL circuit into blocks each having a simply testable circuit configuration and an isolation step S3 for modifying the design of each partitioned block to be singly testable.

Now, the embodiments of the invention will be described with reference to the accompanying drawings.

(Embodiment 1)

Figure 2:
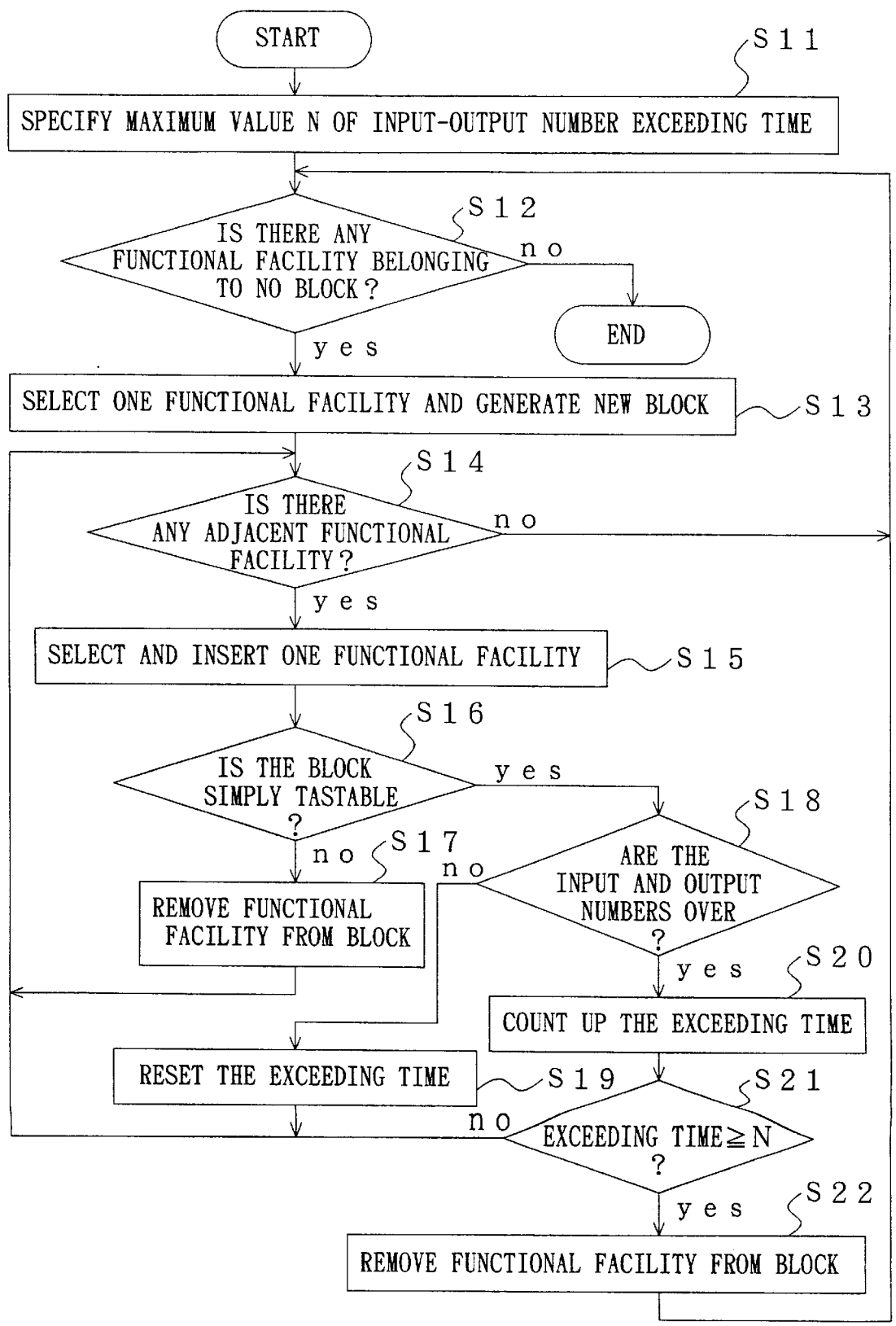
FIG. 2 is a flowchart for showing the procedures of a partitioning step in a method of design for testability at the RTL according to a first embodiment of the invention.

FIG. 2 is a flowchart for showing the procedures of the partitioning step S2 in a method of design for testability at the RTL according to a first embodiment of the invention.

First, in step S11, the maximum value N of an input-output number exceeding time is specified. The value N specified at this point is, in partitioning an RTL circuit into blocks, the maximum number of times for continuously inserting a functional facility into a block described below after the input or output number of the block exceeds the input or output number of the RTL circuit.

Then, in step S12, it is discriminated whether or not the RTL circuit still includes any functional facility belonging to none of the blocks. When the RTL circuit includes such a functional facility, the procedure proceeds to step S13, and when not, the partitioning step S2 is completed.

In step S13, one functional facility is selected among those belonging to none of the blocks, and a new block including the selected functional block is generated.

Subsequently, in step S14, it is discriminated whether or not the RTL circuit includes a functional facility which is adjacent to the new block generated in step S13, does not belong to any of the blocks excluding this new block, and has not been inserted into the new block for checking testability of the resultant block (which is checked in step S16 described below). When the RTL circuit includes such a functional facility, the procedure proceeds to step S15, and when not, the procedure returns to step S12.

In step S15, one functional facility, which is adjacent to the new block generated in step S13, does not belong to any of the blocks excluding the new block and has not been inserted into the new block for checking the testability of the resultant block, is selected, and the selected functional facility is inserted into the new block.

Next, in step S16, it is discriminated whether or not the resultant block is simply testable. The discrimination is effected on the basis of a previously defined simply testable condition. When the block is not simply testable, the procedure proceeds to step S17, and when the block is, the procedure proceeds to step S18.

In step S17, the functional facility inserted in step S15 is removed from the block. Then, the procedure returns to step S14. In step S18, it is discriminated whether or not the input or output number of the new block exceeds the input or output number of the RTL circuit. When not, the procedure proceeds to step S19, and when it does, the procedure proceeds to step S20.

In step S19, an exceeding time, namely, the number of times of the input or output number of the block continuously exceeding the input or output number of the RTL circuit, is reset to be 0 (zero). Then, the procedure returns to step S14.

In step S20, the exceeding time is counted up. Subsequently in step S21, it is discriminated whether or not the exceeding time exceeds the maximum value N specified in step S11. When it does, the procedure returns to step S14, and when not, the procedure proceeds to step S22. In step S22, the functional facilities inserted in step S15 are removed from the new block in a reverse order to an inserting order, so that the input number of the block can be smaller than the input number of the RTL circuit and the output number of the block can be smaller than the output number of the RTL circuit.

Figure 3:
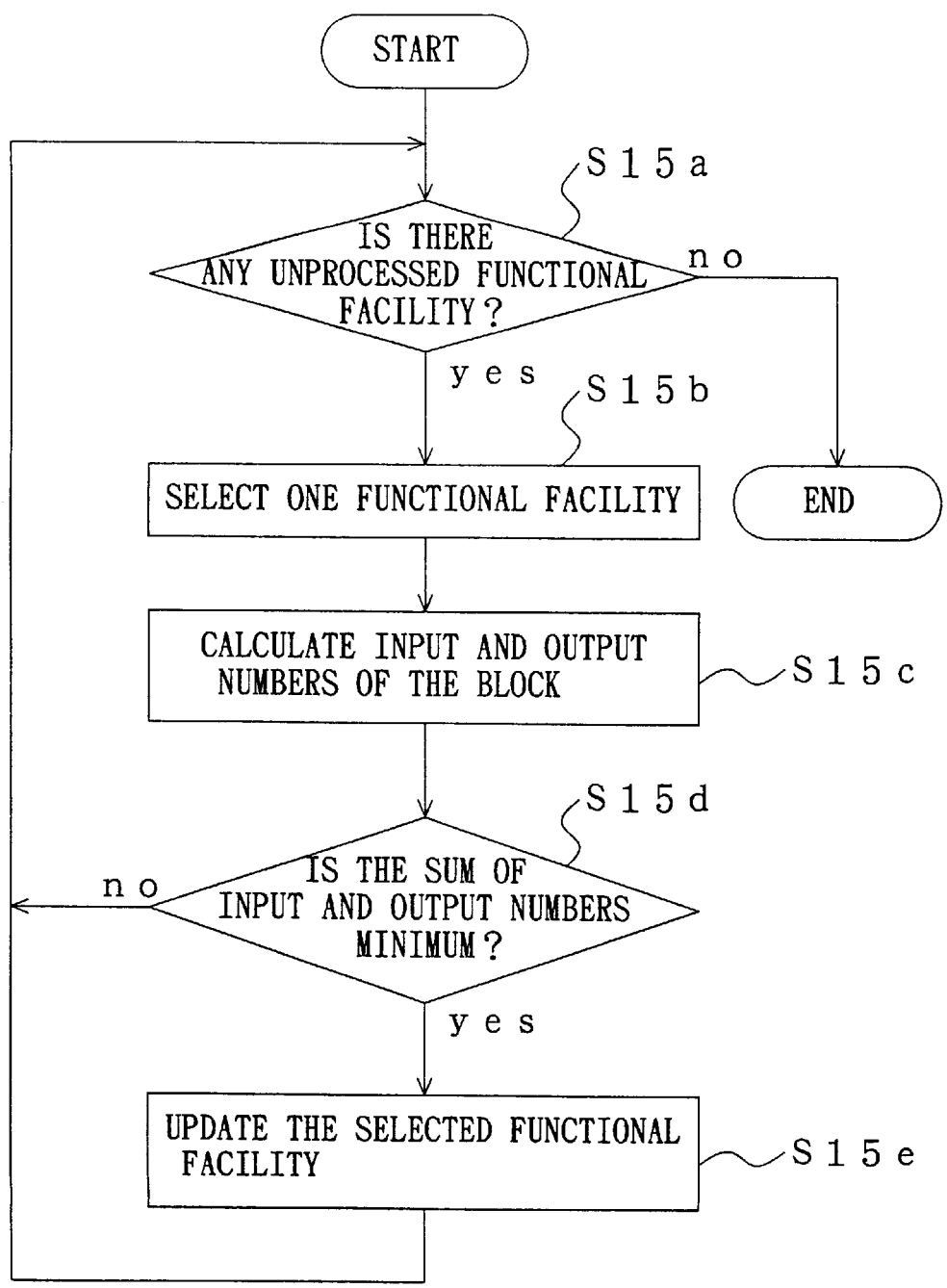
FIG. 3 is a flowchart for showing the procedures in step S15 of the partitioning step of FIG. 2.

FIG. 3 is a flowchart of the detailed procedures conducted in step S15 of the partitioning step S2 of FIG. 2.

First, in step S15a, it is discriminated whether or not the RTL circuit includes an unprocessed functional facility, namely, a functional facility which is adjacent to the new block, does not belong to any of the blocks excluding the new block, and has not been inserted into the block for checking the testability of the resultant block. When the RTL circuit includes such a functional facility, the procedure proceeds to step S15b, and when not, the process is completed.

In step S15b, one unprocessed functional facility is selected. Then, in step S15c, the input and output numbers of the new block are calculated assuming that the functional facility selected in step S15b is inserted into this block.

Next, in step S15d, it is discriminated whether or not the sum of the input and output numbers of the block calculated in step S15c is the minimum thus far. When it is the minimum, the procedure proceeds to step S15e, where the functional facility selected in step S15b and the sum of the input and output numbers of the resultant block are stored, and then the procedure returns to step S15a. When it is not the minimum, the procedure directly returns to step S15a. Through these procedures, one functional facility can be selected so that the sum of the input and output numbers of the resultant block can be minimized through the insertion thereof.

Now, the partitioning step S2 of this embodiment will be described in more detail referring to FIGS. 4(a), 4(b) and 5.

Figure 4A:
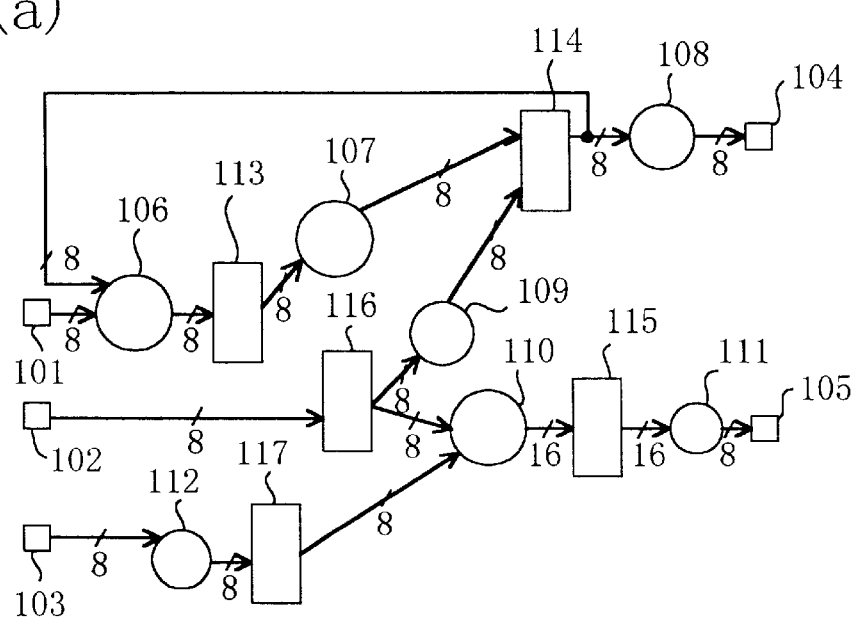
Figure 5:
FIG. 5 shows information on respective blocks in the RTL circuit of FIG. 4(b)

FIG. 4(a) is a diagram for showing the configuration of an RTL circuit, i.e., an object of the method of design for testability at the RTL of this embodiment, which has been designed in an RTL design step S1. The circuit of FIG. 4(a) is expressed as a directed graph. In this graph and all the directed graphs hereinafter described, a node corresponds to a functional facility included in an RTL circuit and an edge corresponds to a signal line for connecting the respective functional facilities.

In FIG. 4(a), reference numerals 101 through 103 denote functional facilities corresponding to external input pins, reference numeral 104 and 105 denote functional facilities corresponding to external output pins, reference numerals 106 through 112 denote functional facilities corresponding to combinational circuits, and reference numerals 113 through 117 denote functional facilities corresponding to registers.

Figure 4B:
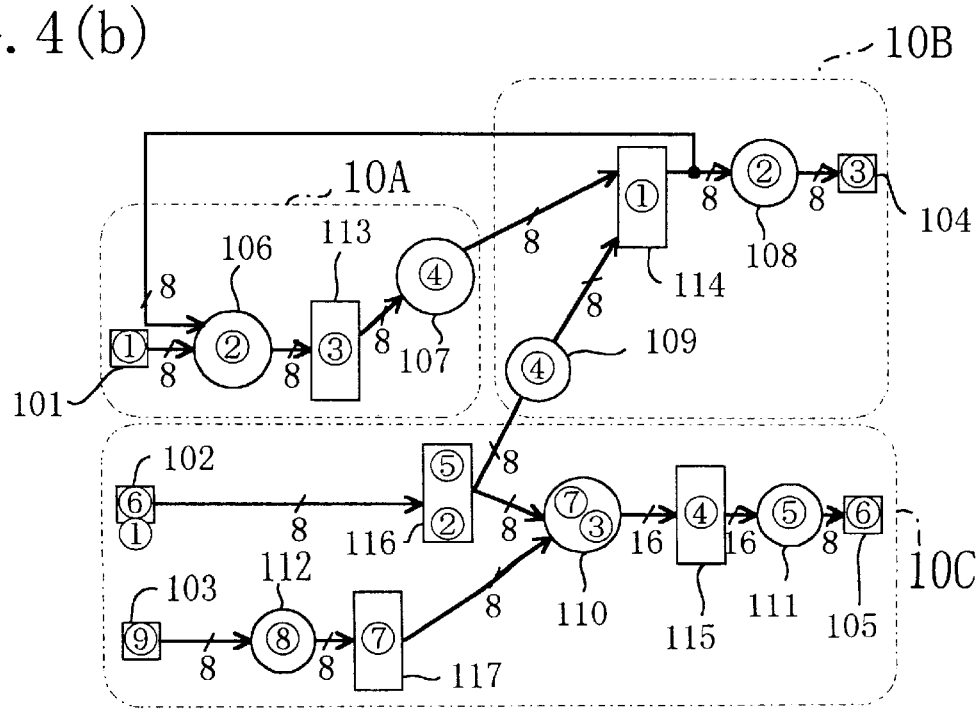

FIG. 4(b) is a circuit resulting from the partitioning step S2 of this embodiment executed on the RTL circuit of FIG. 4(a). In FIG. 4(b), reference numerals 10A through 10C denote blocks generated through the partitioning step S2. It is herein conditioned that a circuit should include no feedback loop, i.e., have an acyclic structure, to be simply testable. The simply testable condition will be described in detail below. Also, in the circuit of FIG. 4(a), the input number and the output number of the LSI (RTL circuit) to be designed are 24 and 16, respectively.

First, in step S11, the maximum number N of the input-output number exceeding time is specified as 3. Then, in steps S12 and S13, the functional facility 101 corresponding to the external input pin is selected as a first functional facility and inserted into a newly generated block.

Next, in steps S14 and S15, the functional facility 106 adjacent to the newly generated block is selected and inserted into the new block. Then, in step S16, it is discriminated whether or not the resultant block is simply testable. Since the functional facilities 101 and 106 do not include a feedback loop, the block under consideration is a simply testable circuit, and hence the procedure proceeds to step S18.

In step S18, the input and output numbers of the new block are both 8, and hence, it is determined that the input-output numbers are not over. Therefore, the procedure proceeds to step S19, where the input-output number exceeding time is reset to be 0, and the procedure returns to step S14.

Through the similar procedures, the functional facilities 113 and 107 are successively selected and inserted into the new block. Next, the functional facility 114 is inserted into the new block, but the resultant block at this point is determined not to be simply testable because the block includes a feedback loop. Therefore, the functional facility 114 is removed from the new block. Then, since there remains no functional facility which is adjacent to the new block, belongs to none of the other blocks and has not been inserted into the new block, the new block is defined as the block 10A of FIG. 4(b). Similarly, the blocks 10B and 10C are defined.

Now, in forming the block 10B, the procedures of the partitioning step S2 of this embodiment conducted when the new block includes the functional facilities 114, 108, 104 and 109 will be described.

First, the functional facility 116, which is adjacent to the new block, belongs to none of the blocks and has not been inserted into the new block, is selected and inserted into the new block. At this point, the new block does not include a feedback loop and hence is determined to be simply testable. However, the output number of the new block at this point is 24, which exceeds the output number of the LSI, i.e., 16. Therefore, the exceeding time is counted up to be 1. Since the exceeding time is smaller than the specified maximum value N (herein 3), the formation of the block is further continued.

Next, since the two functional facilities 102 and 110 are adjacent to the new block, belong to none of the blocks and have not been inserted into the new block, one of them is selected and inserted into the new block. In step S15 of FIG. 3, assuming that the functional facility 102 is inserted, the sum of the input and output numbers of the resultant block is 40, and assuming that the functional facility 110 is inserted, the sum of the input and output numbers of the resultant block is 56. Therefore, the functional facility 102 is selected and inserted so that the sum of the input and output numbers of the resultant block can be minimized. Also at this point, the output number of the block exceeds the output number of the LSI, the exceeding time is counted up to be 2.

Then, the functional facility 110 is inserted into the new block, and the output number of the resultant block exceeds the output number of the LSI, and hence the exceeding time is counted up to be 3. Since the exceeding time is equal to the specified maximum value, the functional blocks 110, 102 and 116 are successively removed from the new block in this order until the input and output numbers of the resultant block are smaller than the input and output numbers of the LSI, respectively. Thus, the block 10B is formed.

All of the blocks 10A, 10B and 10C thus formed satisfy the simply testable condition. FIG. 5 is a diagram for showing information on the respective blocks in the circuit of FIG. 4(b). In FIG. 5, encircled numerals indicate stages for forming the blocks and correspond to encircled numerals shown in the respective functional facilities of FIG. 4(b).

In the above description, the simply testable condition is defined as that a circuit should include no feedback loop, i.e., have an acyclic structure., but another condition is also adoptable. Now, the simply testable condition will be described.

Figure 6:
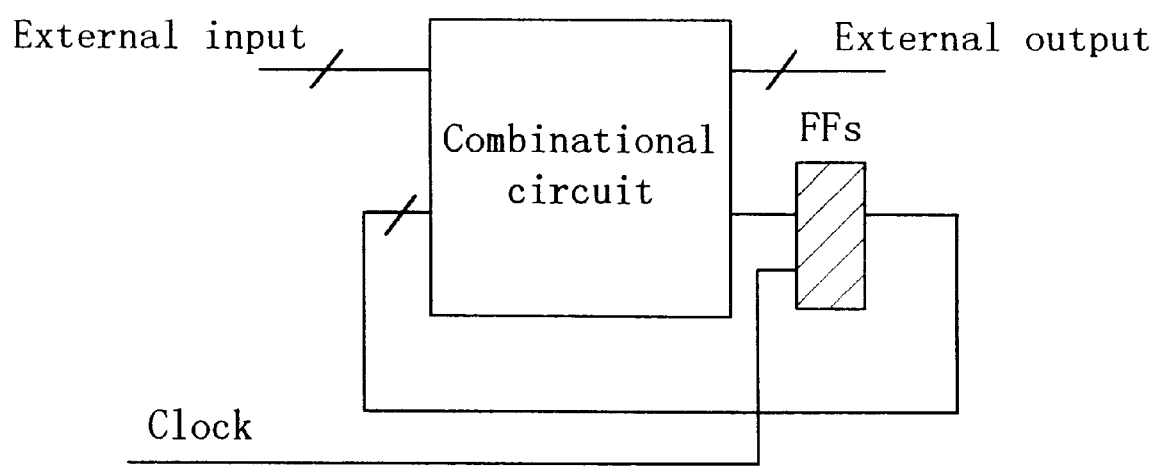
FIG. 6 is a diagram of a model of a synchronous sequential circuit.

FIG. 6 is a conceptual diagram for showing a synchronous sequential circuit model. As is shown in FIG. 6, a synchronous sequential circuit is modeled by using a combinational circuit and a group of registers (FFs) operated in accordance with a clock.

Figure 7:
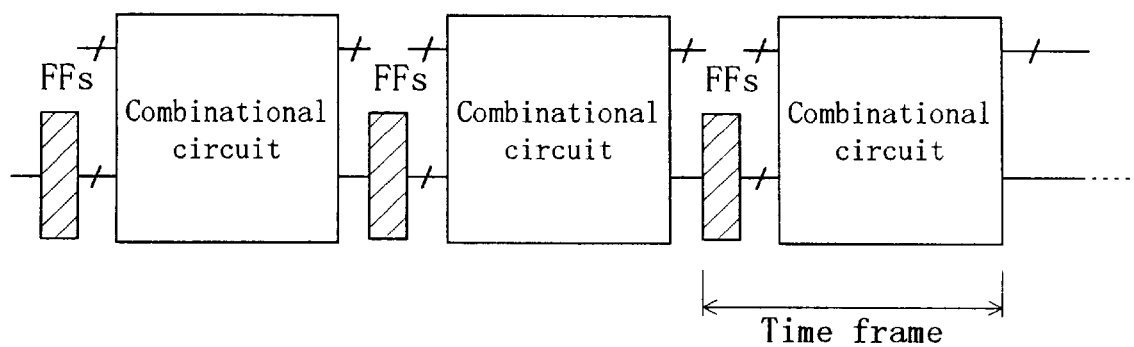
FIG. 7 is a diagram of a time-axis expanded sequential circuit.

In a general ATPG algorithm for a sequential circuit, a test sequence is generated after time-axis expansion of the sequential circuit. FIG. 7 is a diagram for showing the result of the time-axis expansion of the synchronous sequential circuit mode of FIG. 6, wherein a circuit on each time-axis is designated as a time frame.

The sequential circuit is classified, on the basis of ATPG complexity, into three types: (i) a cyclic structure, (ii) an acyclic structure and (iii) a configuration having combinational ATPG complexity.

A sequential circuit having the cyclic structure (i) is not simply testable in general because the number of time frames required for generating a test sequence depends upon the number of loops in the sequential circuit and the number of FFs in the loops, and is very large.

A sequential circuit in the configuration having combinational ATPG complexity (iii) is applicable to the combinational circuit ATPG, namely, a test sequence can be generated by replacing the FFs in the sequential circuit with signal lines. Therefore, merely one time frame is required, and hence such a circuit is simply testable. Accordingly, the configuration having combinational ATPG complexity (iii) can be defined as the simply testable condition. However, in this case, the size of each block is too small, and the number of the blocks can be very large.

In the acyclic structure (ii) defined as the simply testable condition in this embodiment, the number of time frames required for generating a test sequence is smaller than a value obtained by adding 1 to a sequential depth of the circuit. Therefore, the acyclic structure (ii) is more simply testable than the cyclic structure (i). The sequential depth herein means a number of FFs belonging to a signal path, and the sequential depth of a circuit is the maximum value of the sequential depths of all the signal paths between external input pins and external output pins. Alternatively, in addition to the acyclic structure (ii), a sequential depth of a circuit being smaller than a predetermined value can be defined as the simply testable condition.

Moreover, in the present invention, an n-fold line-up structure (wherein n is a positive integer) is proposed to be defined as the simply testable condition. The n-fold line-up structure means a configuration where the number of sorts of sequential depths of signal paths between an arbitrary pair of a register in a circuit and an external output or pseudoexternal output is smaller than n, whereas the register is disposed none of the signal paths between the register and the external output or pseudo-external output.

Figure 8:
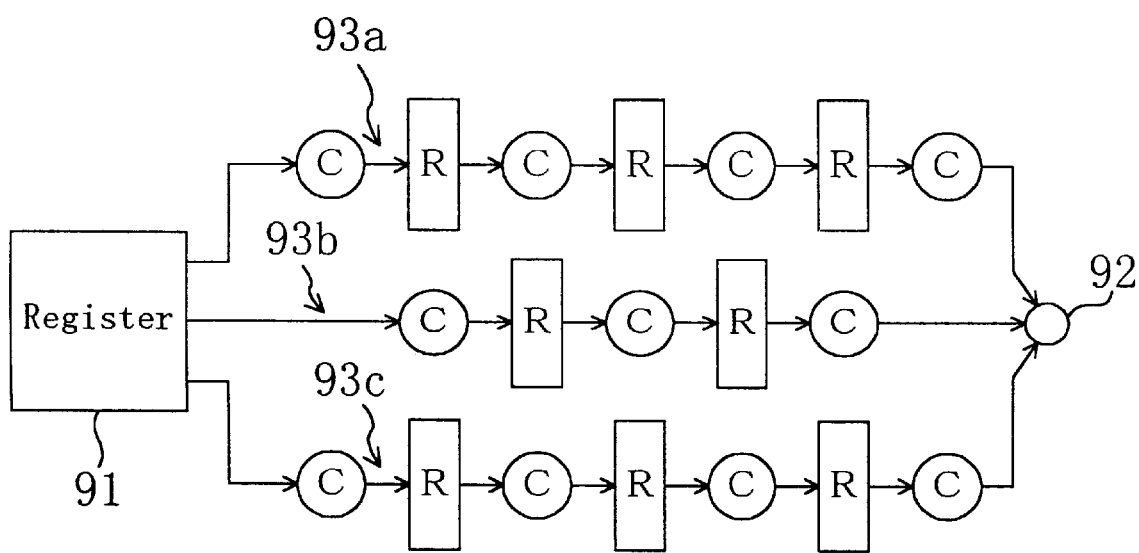
FIG. 8 is a diagram for showing an example of an n-fold line-up structure, wherein n=2, i.e., a two-fold line-up structure.

FIG. 8 is a diagram for showing an example of the n-fold line-up structure wherein n=2, namely, a two-fold line-up structure. In FIG. 8, a reference numeral 91 denotes the arbitrary register in the circuit, a reference numeral 92 denotes the arbitrary external output or pseudo-external output, reference numerals 93a, 93b and 93c denote the paths between the register 91 and the external output or pseudo-external output 92, R denotes each register on the paths 93a, 93b and 93c, and C denotes each combinational circuit on the paths 93a, 93b and 93c. As is shown in FIG. 8, the sequential depths of the paths 93a and 93c are 3, and the sequential depth of the path 93b is 2. Therefore, there are two sorts of the sequential depths in the respective paths between the register 91 and the external output or pseudoexternal output 92. Accordingly, the circuit of FIG. 8 has the two-fold line-up structure.

Figure 9:
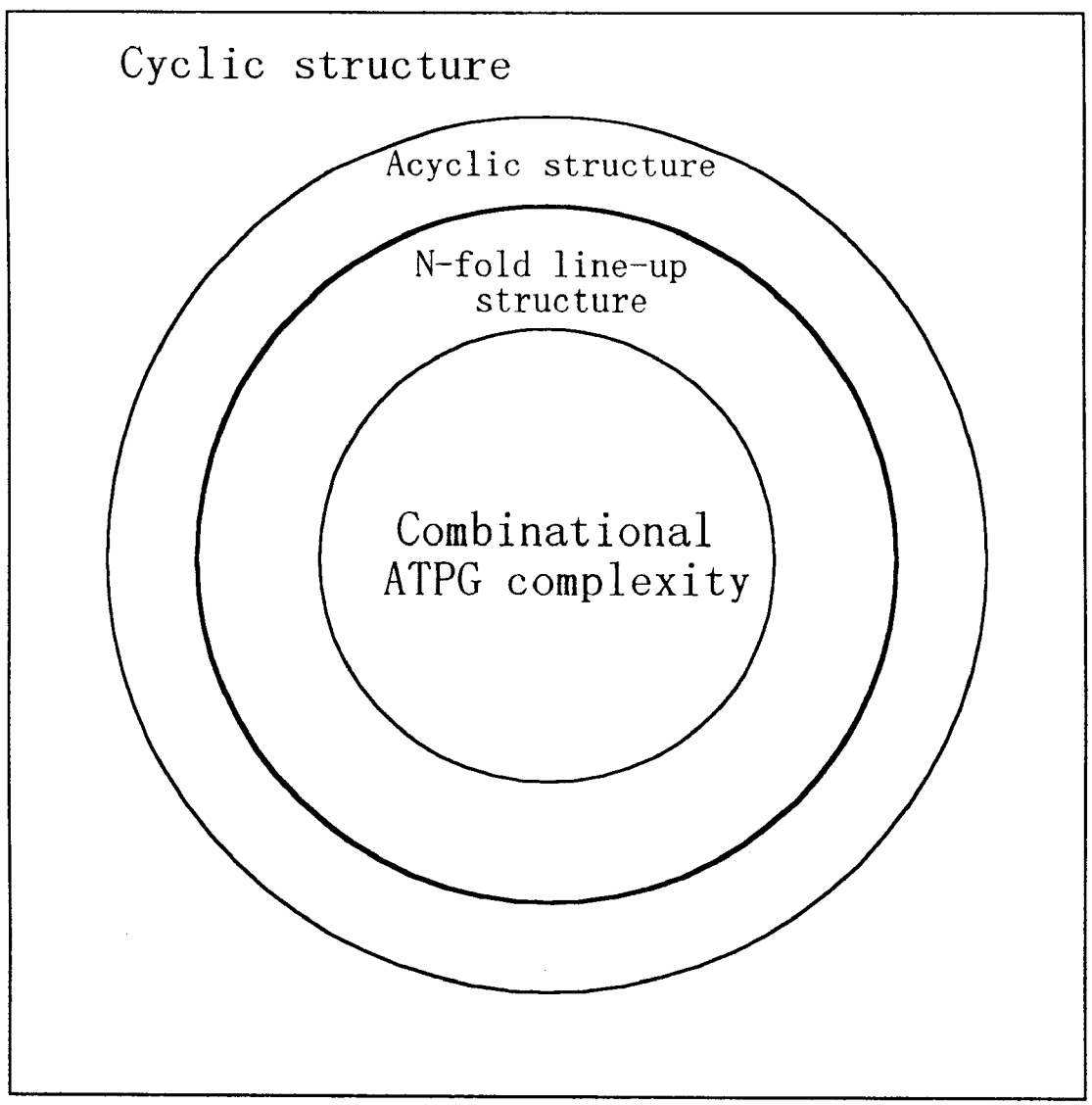
FIG. 9 is a diagram for showing classification of synchronous sequential circuits according to their configurations.

FIG. 9 is a diagram for showing classification of sequential circuits on the basis of their configurations. As is shown in FIG. 9, the acyclic structure includes the n-fold line-up structure, and the n-fold line-up structure includes the configuration having combinational ATPG complexity. In other words, the n-fold line-up structure is a concept narrower than the acyclic structure and wider than the configuration having combinational ATPG complexity. As the value n is increased, the n-fold line-up structure approximates to the acyclic structure, and as the value n is decreased, the n-fold line-up structure approximates to the configuration having combinational ATPG complexity.

A circuit having the n-fold line-up structure has a characteristic that the number of time frames including each register obtained through the time-axis expansion about an arbitrary external output or pseudo-external output is limited to be n or less. In the case where n=1, namely, in a onefold line-up structure, the number of time frames including each register obtained by the time-axis expansion about an arbitrary external output or pseudo-external output is limited to 1. Such a one-fold line-up structure is simply designated as a line-up structure. In other words, a circuit configuration where each register belongs to merely one time frame obtained through the time-axis expansion about an arbitrary external output or pseudo-external output is defined as a line-up structure.

Figure 10A:
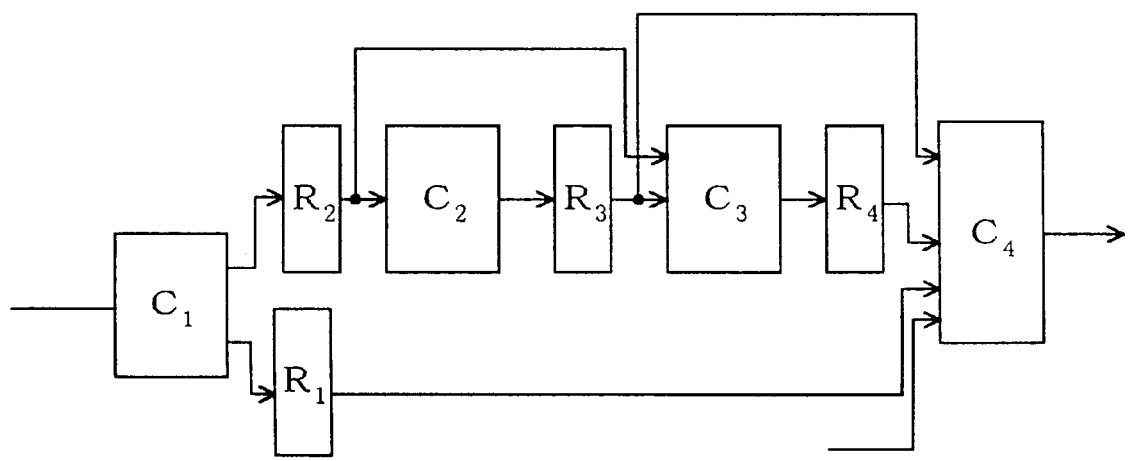
FIG. 10(a) is a diagram of a circuit having an acyclic structure.
Figure 10B:
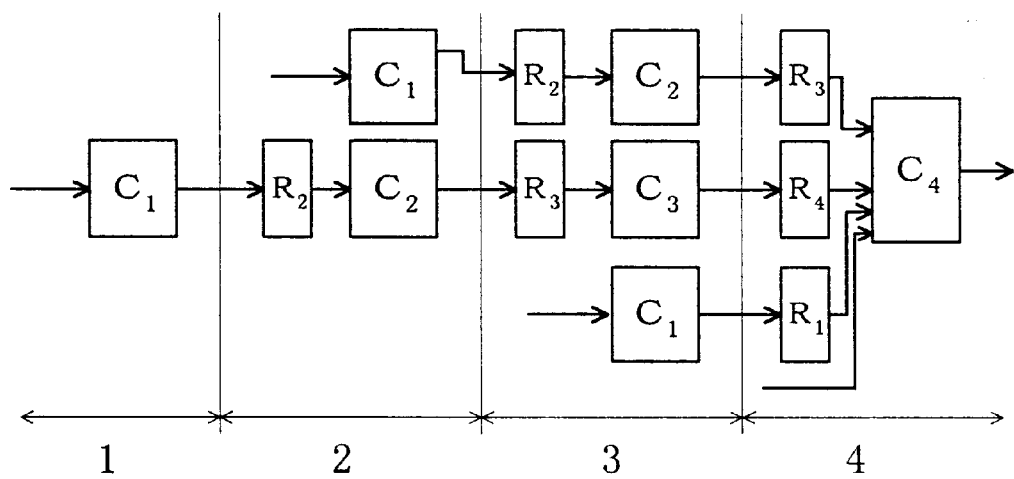
FIG. 10(b) is a diagram of a circuit resulting from time-axis expansion of the circuit of FIG. 10(a)

FIG. 10(a) is a conceptual diagram for showing a circuit having the acyclic structure, wherein $R_1$, $R_2$, $R_3$ and $R_4$ denote registers and $C_1$, $C_2$, $C_3$ and $C_4$ denote combinational circuits. FIG. 10(b) is a conceptual diagram resulting from the time-axis expansion of the circuit having the acyclic structure shown in FIG. 10(a).

In the time-axis expansion of the circuit having the acyclic structure, there can exist registers belonging to plural time frames, such as registers $R_2$ and $R_3$ of FIG. 10(b).

Figure 11A:
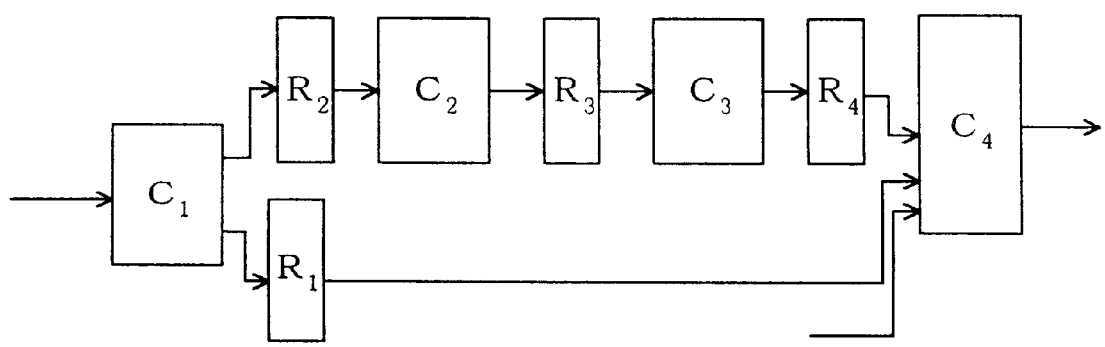
FIG. 11(a) is a diagram of a circuit having a line-up structure.
Figure 11B:
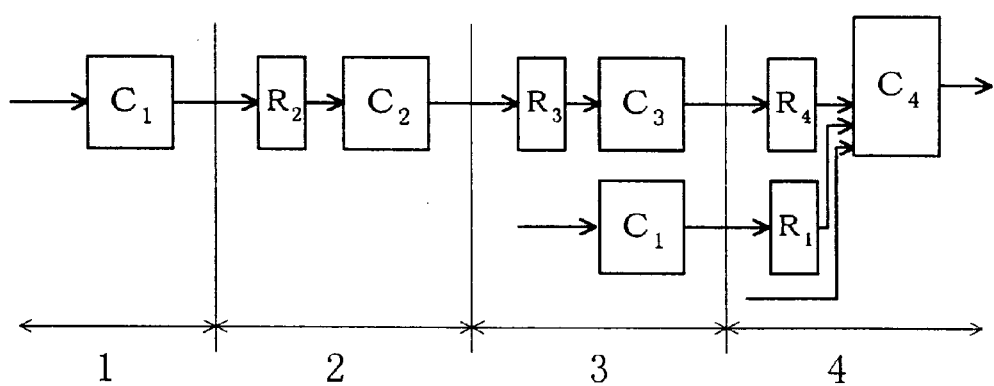
FIG. 11(b) is a diagram of a circuit resulting from time-axis expansion of the circuit of FIG. 11(a)

FIG. 11(a) is a conceptual diagram for showing a circuit having the line-up structure, wherein, similarly to FIG. 11(a), $R_1$, $R_2$, $R_3$ and $R_4$ denote registers and $C_1$, $C_2$, $C_3$ and $C_4$ denote combinational circuits. FIG. 11(b) is a conceptual diagram resulting from the time-axis expansion of the circuit having the line-up structure shown in FIG. 11(a). As is shown in FIG. 11(b), in the time-axis expansion of the circuit having the line-up structure, each of the respective registers $R_1$ through $R_4$ belongs to merely one time frame.

In the line-up structure, the number of functional facilities included in each time frame is smaller than in the acyclic structure, and hence, less calculation is required for generating a test sequence. Moreover, in the acyclic structure, there exists a register, such as the register $R_2$ of FIG. 10(b), which is demanded to be assigned to plural combinational circuits. Thus, there is a possibility of contradiction in the generation of a test sequence. In contrast, there is less possibility of the contradiction in the line-up structure. Accordingly, the line-up structure is more simply testable than the acyclic structure.

In addition to the line-up structure, a sequential depth of a circuit being a predetermined value or less can be defined as the simply testable condition.

(Embodiment 2)

Figure 12:
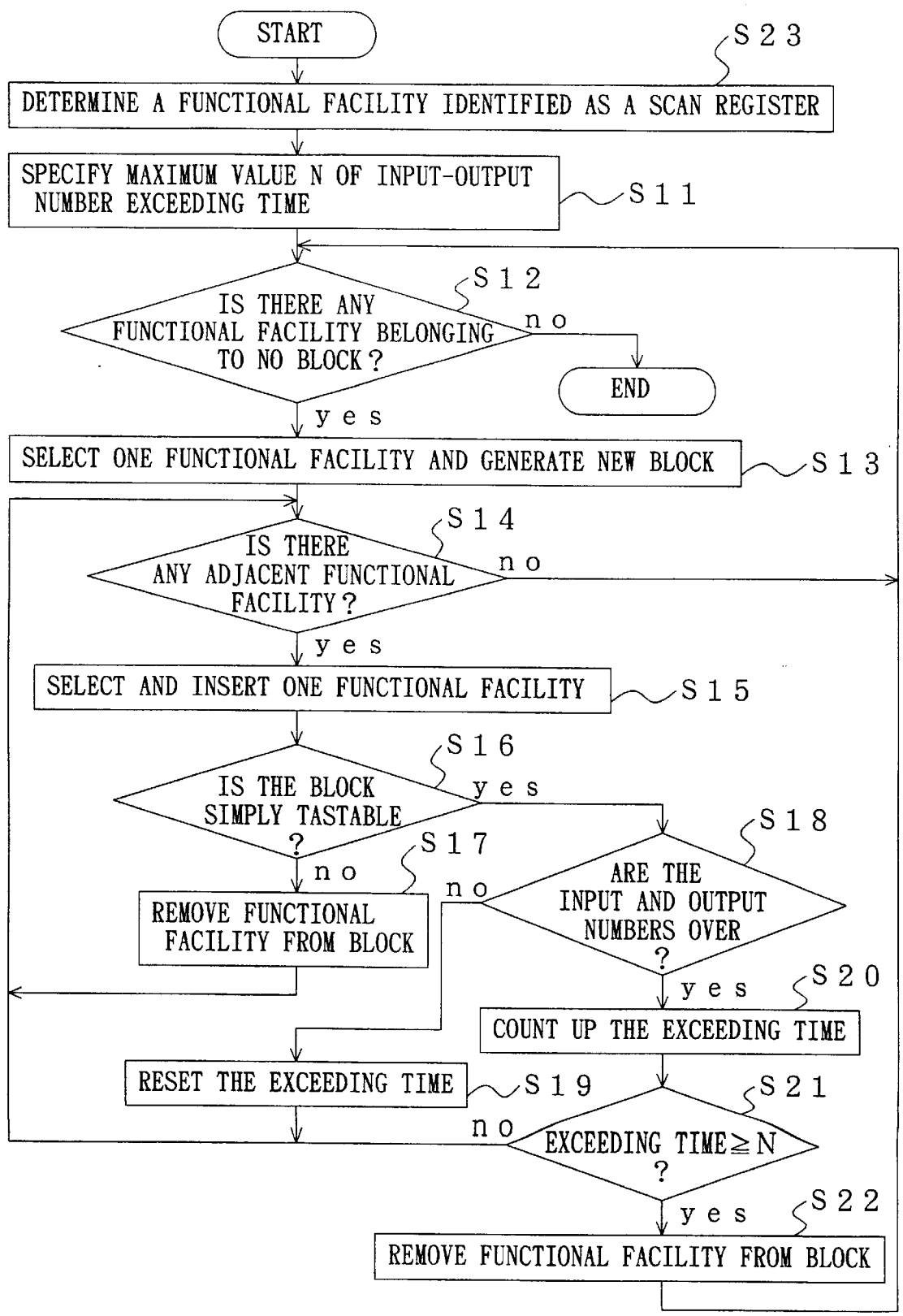
FIG. 12 is a flowchart for showing the procedures of a partitioning step in a method of design for testability at the RTL according to a second embodiment of the invention.

FIG. 12 is a flowchart for showing the procedures of the partitioning step S2 in a method of design for testability at the RTL according to a second embodiment of the invention. The partitioning step S2 of this embodiment shown in FIG. 12 includes, as a preprocessing, step S23 for identifying a register having a self-loop and a finite state machine as a scan register in addition to the procedures of the partitioning step S2 of the first embodiment.

The partitioning step S2 of this embodiment will now be described in more detail referring to FIGS. 13(a), 13(b) and 14.

Figure 13A:
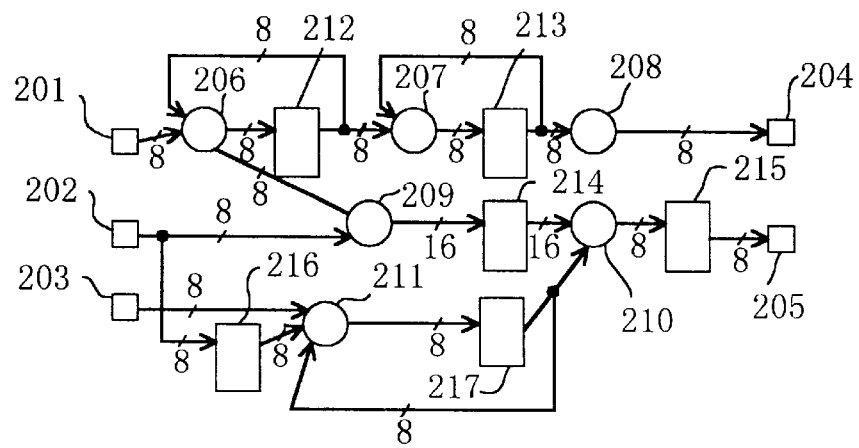

FIG. 13(a) is a diagram for showing the configuration of an RTL circuit, i.e., an object of the method of design for testability at the RTL of this embodiment, designed in the RTL design step S1. FIG. 13(b) is a diagram resulting from the partitioning step S2 of this embodiment executed on the RTL circuit of FIG. 13(a). In FIGS. 13(a) and 13(b), reference numerals 201 through 203 denote functional facilities corresponding to external input pins, reference numerals 204 and 205 denote functional facilities corresponding to external output pins, reference numerals 206 through 211 denote functional facilities corresponding to combinational circuits, and reference numerals 212 through 217 denote functional facilities corresponding to registers. In FIG. 13(b), 20A and 20B denote blocks generated through the partitioning step S2.

Figure 13B:
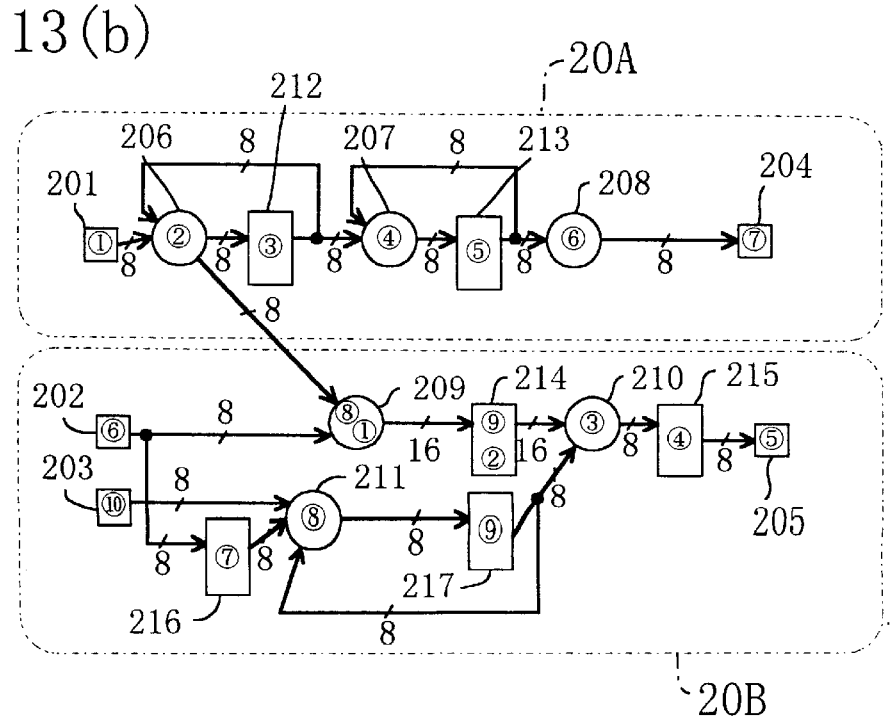

FIG. 14 is a diagram for showing information on the respective blocks in the RTL circuit shown in FIG. 13(b), wherein encircled numerals indicate stages for generating the blocks and correspond to encircled numerals shown in the respective functional facilities of FIG. 13(b).

First, in step S23, the functional facilities 112, 113 and 117 each corresponding to a register having a self-loop are identified as scan registers. Thereafter, the similar procedures to those of the first embodiment are conducted, so that the blocks 20A and 20B are generated as shown in FIG. 13(b).

Although the blocks 20A and 20B both include feedback loops, the functional facilities 112, 113 and 117 corresponding to the registers are identified as the scan registers in step S23, and hence, the input-output of the functional facilities 112, 113 and 117 are regarded to be disconnected. Accordingly, the configurations of the blocks 20A and 20B are both equivalent to the acyclic structure having no feedback loop, and hence they are determined to be simply testable.

(Embodiment 3)

Figure 15:
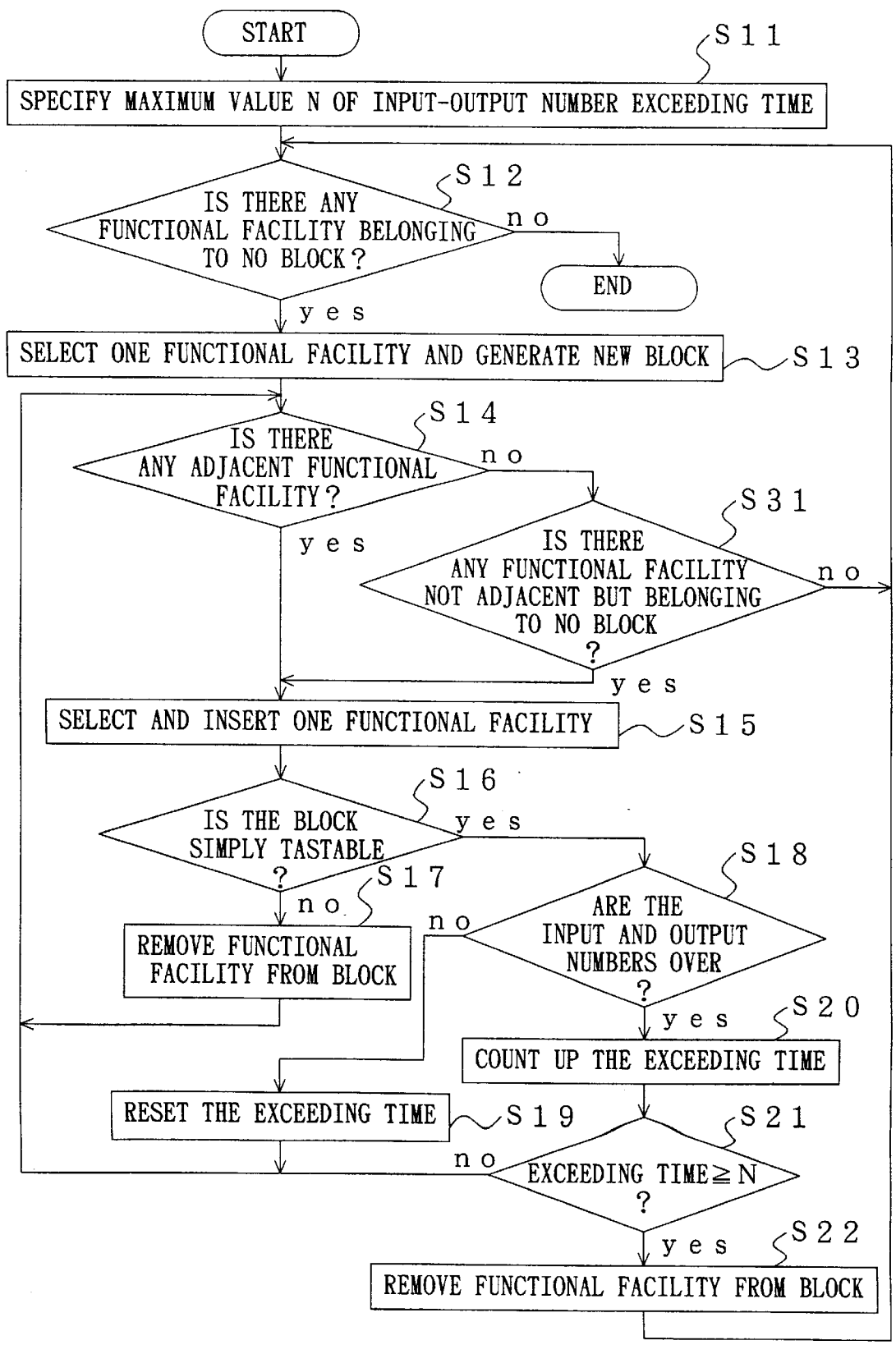
FIG. 15 is a flowchart for showing the procedures of a partitioning step in a method of design for testability at the RTL according to a third embodiment of the invention.

FIG. 15 is a flowchart for showing the procedures of the partitioning step S2 in a method of design for testability at the RTL according to a third embodiment. The partitioning step S2 of this embodiment shown in FIG. 15 includes step S31 in addition to the procedures of the partitioning step S2 of the first embodiment. When it is determined in step S14 that the RTL circuit does not include any functional facility which is adjacent to the new block generated in step S13, does not belong to any of the blocks excluding the new block, and has not been inserted into the new block for checking the testability of the resultant block, the procedure proceeds to step S31. In step S31, it is discriminated whether or not there exist a functional block which is not adjacent to the new block and belongs to none of any other blocks. When such a block exists, the procedure proceeds to step S15, and when not, the procedure returns to step S12.

The partitioning step S2 of this embodiment will now be described in more detail with reference to FIGS. 16 and 17.

Figure 16:
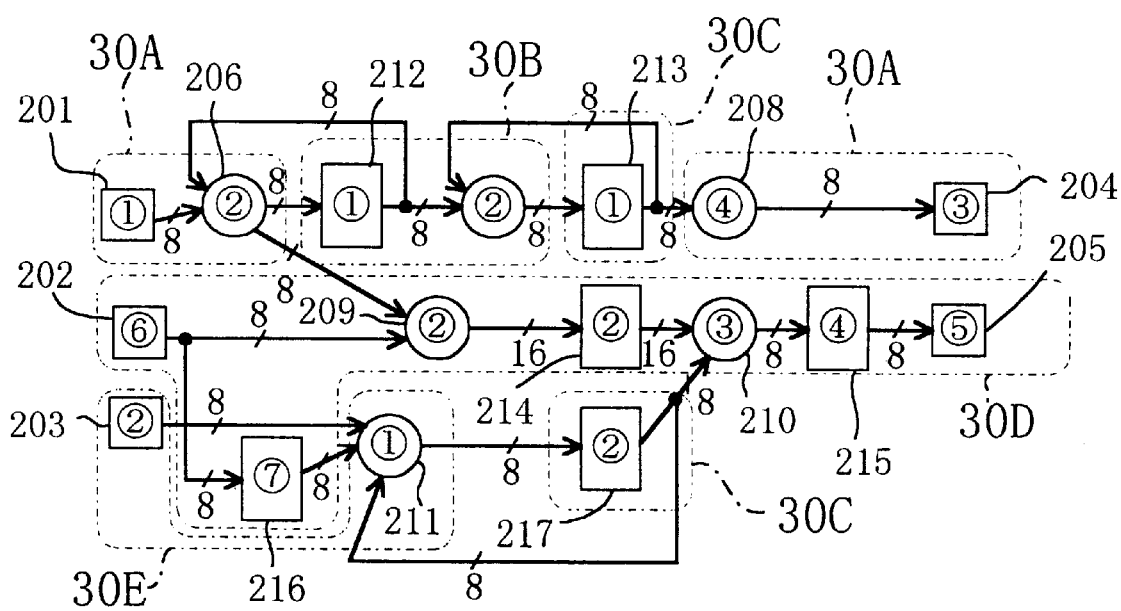
FIG. 16 illustrates the partitioning step in the method of design for testability at the RTL of the third embodiment, corresponding to a diagram resulting from the partitioning step executed on the circuit of FIG. 12(a)

FIG. 16 is a diagram resulting from the partitioning step S2 of this embodiment executed on the RTL circuit shown in FIG. 13(a). In FIG. 16, reference numerals 30A, 30B, 30C, 30D and 30E denote blocks generated through the partitioning step S2. FIG. 17 is a diagram for showing information on the respective blocks of FIG. 16, wherein encircled numerals correspond to encircled numerals shown in respective functional facilities of FIG. 16.

First, similarly to the first embodiment, the functional facility 201 corresponding to the external input pin is first selected for the formation of the block. The functional facilities belonging to this block are the functional facility 201 corresponding to the external input pin and the functional facility 206 corresponding to the combinational circuit. At this point, the input and output numbers of the block still does not exceed those of the RTL circuit, and therefore, in steps S31 and S15, the functional facility 204 corresponding to the external output pin is selected as the functional facility which is not adjacent to this block and does not belong to any other blocks, and is inserted into this block. The functional facility 208 corresponding to the combinational circuit is further selected and inserted, and thus, the block 30A is defined. The other blocks are also formed in the same manner, thereby partitioning the RTL circuit into the five blocks 30A through 30E.

In this manner, in the partitioning step of this embodiment, the functional facilities not adjacent to the block under consideration are inserted into the block when the input and output numbers of the block does not exceed those of the circuit. This results in decreasing the number of the blocks included in the RTL circuit.

(Embodiment 4)

Figure 18:
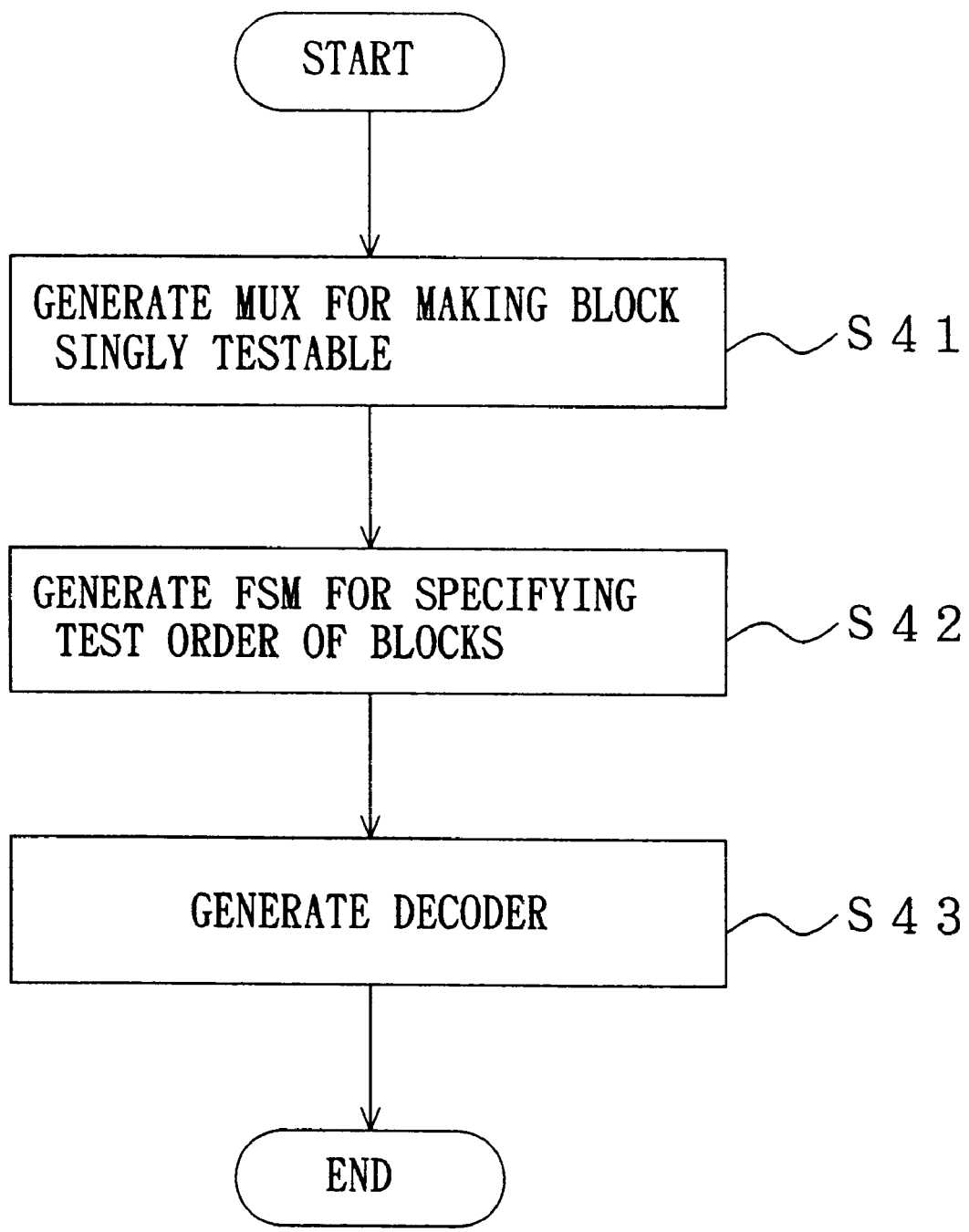
FIG. 18 is a flowchart for showing the procedures of an isolation step in a method of design for testability at the RTL according to a fourth embodiment of the invention.

FIG. 18 is a flowchart for showing the procedures of the isolation step S3 in a method of design for testability at the RTL according to a fourth embodiment of the invention.

First, in step S41, an input controlling multiplexer (MUX) for directly externally controlling an input of a block, an output observing multiplexer for directly externally observing an output of a block and a test mode pin for switching between a normal operation and a test operation are generated, so that the input-output of each block generated in the partitioning step S2 can be directly controlled and observed from the outside of the RTL circuit.

Then, the data input of the input controlling multiplexer is connected with an input signal line used in the normal operation of the block to be controlled and with an external input pin for controlling the other blocks excluding the block to be controlled. The control input of the input controlling multiplexer is connected with the test mode pin, and the data output thereof is connected with the input of the block to be controlled. Also, the data input of the output observing multiplexer is connected with an output signal line of a block to be observed, and the data output thereof is connected with an external output pin.

Next, in step S42, a finite state machine (FSM) for specifying a testing order of the blocks and a clock pin for controlling the finite state machine are generated. The content of a register included in the finite state machine corresponds to a block under test.

Then, in step S43, a decoder for decoding the content of the register of the finite state machine is generated, and the output line of the decoder is connected with the control input of the output observing multiplexer generated in step S41.

The isolation step S3 of this embodiment will now be described in more detail with reference to FIGS. 19(a) through 19(c).

Figure 19A:
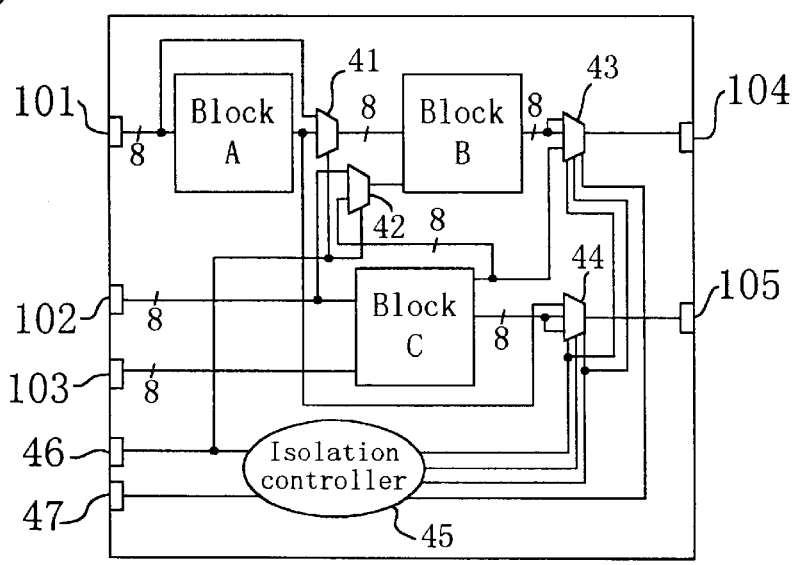
FIG. 19(a) is a diagram resulting from the isolation step of the fourth embodiment executed on the RTL circuit partitioned into blocks shown in FIG. 4(b)

FIG. 19(a) is a diagram resulting from the isolation step S3 of this embodiment executed on the RTL circuit having been partitioned into the blocks shown in FIG. 4(b).

In FIG. 19(a), a block A is obtained by removing the functional facility 101 corresponding to the external input pin from the block 10A, a block B is obtained by removing the functional facility 104 corresponding to the external output pin from the block 10B, and a block C is obtained by removing the functional facilities 102 and 103 corresponding to the external input pins and the functional facility 105 corresponding to the external output pin from the block 10C.

Also in FIG. 19(a), reference numerals 41 and 42 denote two-input input controlling multiplexers, reference numerals 43 and 44 denote multi-input output observing multiplexers, a reference numeral 45 denotes a circuit (isolation controller) formed by combining a decoder with a finite state machine for controlling the output observing multiplexers 43 and 44, namely, for specifying a block to be tested, a reference numeral 46 denotes a test mode pin, and a reference numeral 47 denotes a clock pin for driving the isolation controller 45.

In order that input signals from the blocks A and C to the block B may be directly controlled through the external input pins 101 and 102 in the test mode, the test mode pin 46 and the input controlling multiplexers 41 and 42 are generated, and the control inputs of the input controlling multiplexers 41 and 42 are connected with the test mode pin 46.

In order that an output signal to the block B from the block A may be directly observed through the external output pin 105 in the test mode, the output observing multiplexer 44 is generated. Also, in order that an output signal to the block B from the block C may be directly observed through the external output pin 104 in the test mode, the output observing multiplexer 43 is generated.

Furthermore, in order to control a signal to be observed through the external output pin, the isolation controller 45 and the clock pin 47 for driving the isolation controller 45 are generated. The control inputs of the output observing multiplexers 43 and 44 are connected with the isolation controller 45.

As a result, each of the blocks A, B and C can singly generate a test input.

Figure 19B:
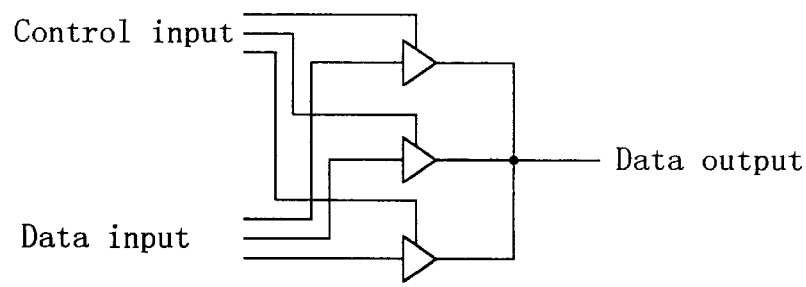
FIG. 19(b) is a logical circuit diagram for showing an example of the configuration of an output observing multiplexer of FIG. 19(a)
Figure 19C:
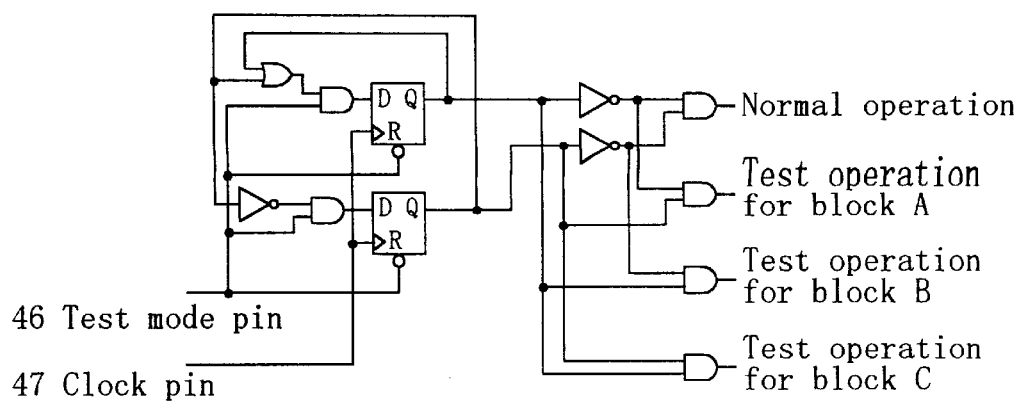
FIG. 19(c) is a logical circuit diagram for showing an example of the configuration of an isolation controller of FIG. 19(a)

FIG. 19(b) is a logical circuit diagram for showing an example of the configuration of the output observing multiplexers 43 and 44. FIG. 19(*c*) is a logical circuit diagram for showing an example of the configuration of the isolation controller 45.

Figure 20:
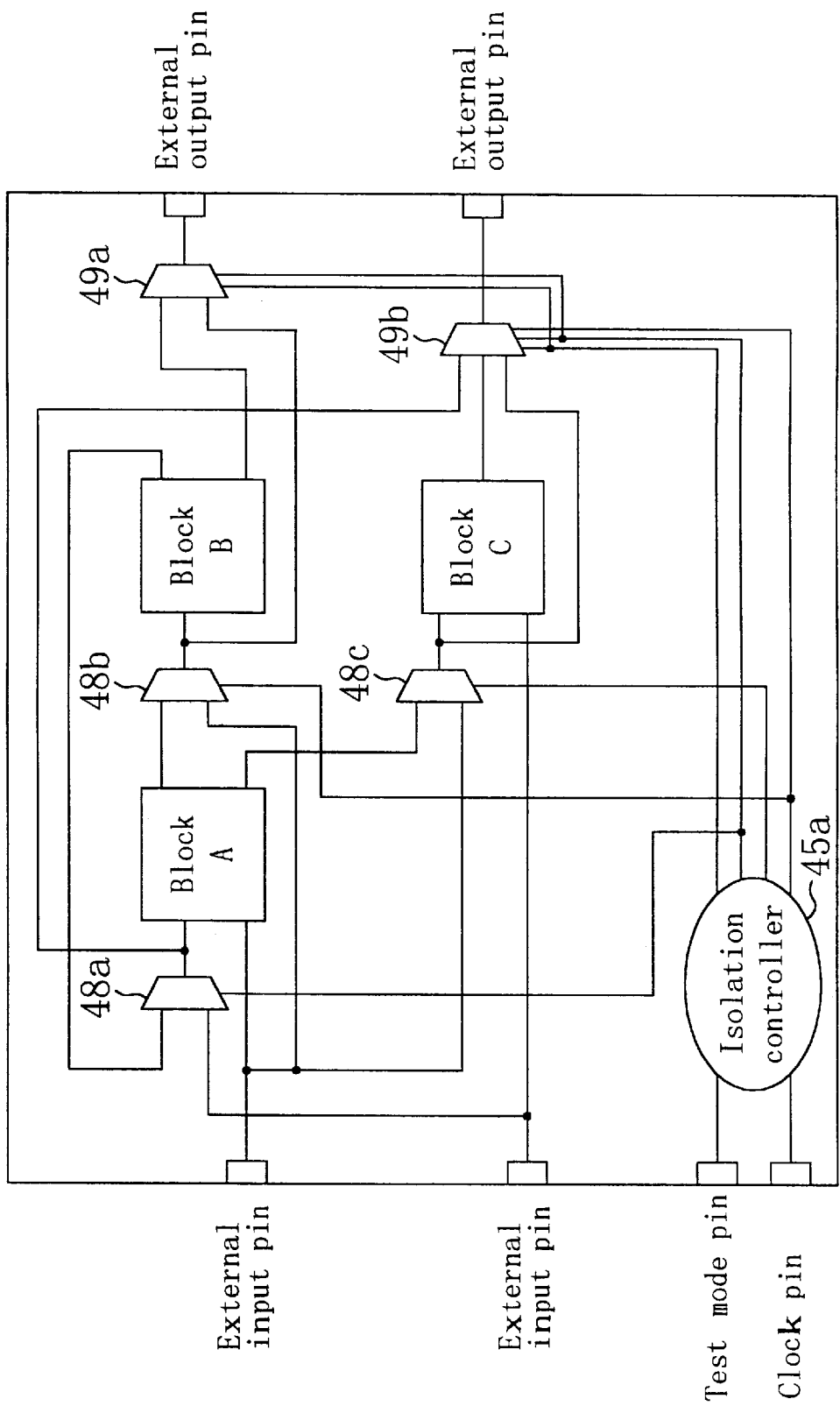
FIG. 20 is a diagram resulting from the isolation step of the fourth embodiment.

Alternatively, the input controlling multiplexer also can be controlled by the isolation controller not through the test mode pin. Specifically, in step S41, the control input of the input controlling multiplexer is not connected with the test mode pin, and in step S43, the output signal line of the isolation controller is connected with not only the control input of the output observing multiplexer but also the control input of the input controlling multiplexer. FIG. 20 is a diagram for showing the result of such an isolation step S3. As is shown in FIG. 20, input controlling multiplexers 48*a*, 48*b* and 48*c* are controlled by an isolation controller 45A similarly to output observing multiplexers 49*a* and 49*b*.

(Embodiment 5)

Figure 21:
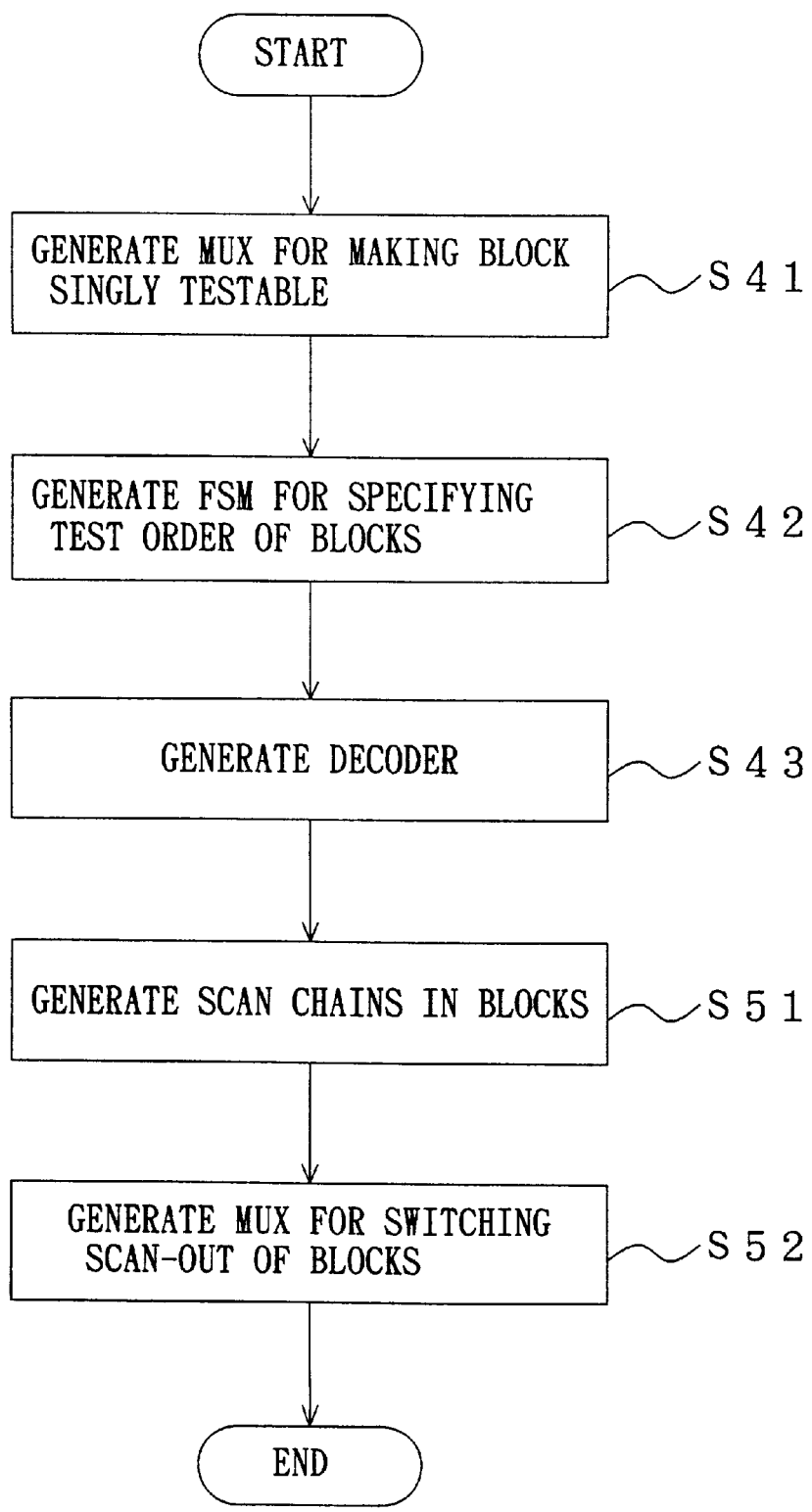
FIG. 21 is a flowchart for showing the procedures of an isolation step in a method of design for testability at the RTL according to a fifth embodiment of the invention.

FIG. 21 is a flowchart for showing the procedures of the isolation step S3 in a method of design for testability at the RTL according to a fifth embodiment of the invention. The isolation step S3 of this embodiment is adopted when an RTL circuit is partitioned into blocks with a register having a self-loop identified as a scan register as in the partitioning step S2 of the second embodiment.

Steps S41 through S43 are the same as those in the isolation step S3 of the fourth embodiment shown in FIG. 18, and through these steps, each block in the RTL circuit can attain the configuration which can singly generate a test input.

In step S51, the register having the self-loop identified as the scan register in each block is replaced with a scan register, so that a scan chain can be formed in each block, and a scan-in extern input pin is connected with the scan-in input of each block.

Next, in step S52, one multiplexer for switching scan-out of each block which has data inputs in the same number as the number of the blocks including the scan registers is generated. The data inputs of this multiplexer are connected with the scan-out outputs of the respective blocks, the control input thereof is connected with the output of the isolation controller generated in step S42 and S43, and the output thereof is connected with the scan-out external output pin.

The isolation step S3 of this embodiment will now be described in more detail with reference to FIG. 22.

Figure 22:
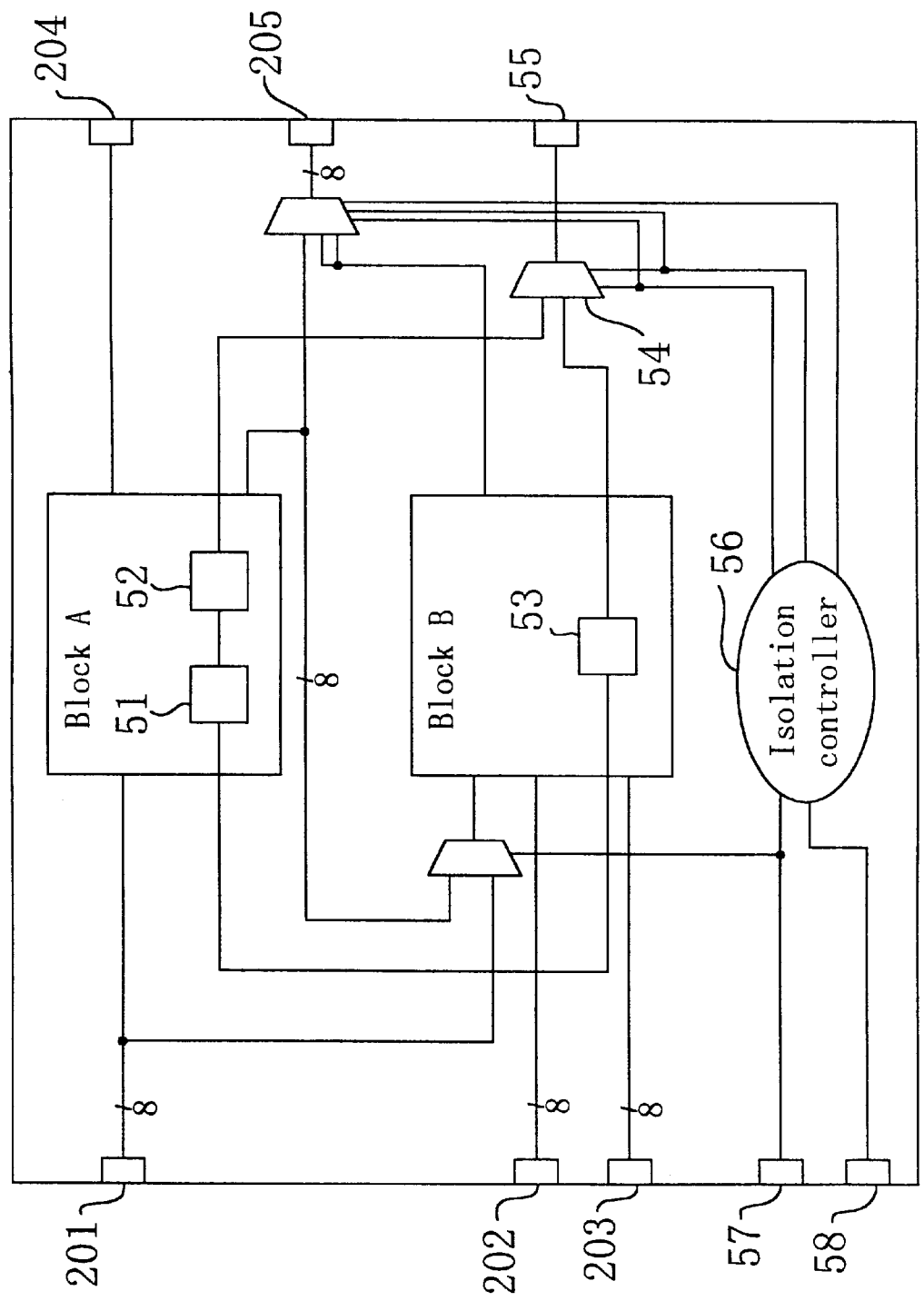
FIG. 22 is a diagram resulting from the isolation step of the fifth embodiment executed on the RTL circuit partitioned into blocks shown in FIG. 13(b)

FIG. 22 is a circuit diagram resulting from the isolation step S3 of this embodiment executed on the RTL circuit having been partitioned into the blocks shown in FIG. 13(*b*), wherein a test circuit is inserted into each block so that the block can singly generate a test input.

In FIG. 22, a block A is obtained by removing the external input pin 201 and the external output pin 204 from the block 20A of FIG. 13(*b*), a block B is obtained by removing the external input pins 202 and 203 and the external output pin 205 from the block 20B of FIG. 13(*b*), and reference numerals 51, 52 and 53 denote scan registers replaced with the registers 212 and 213 and 217 each having a self-loop shown in FIG. 13(*b*). Also, a reference numeral 54 denotes a multiplexer for switching the scan-out of each block, a reference numeral 55 denotes a scan-out external output pin, a reference numeral 56 denotes an isolation controller including a decoder and a finite state machine for controlling the respective multiplexers, namely, for specifying a block to be tested, a reference numeral 57 denotes a test mode pin, and a reference numeral 58 denotes a clock pin for driving the isolation controller 56.

In steps S41 through S43, a test circuit is inserted into each of the blocks A and B so that each block can singly generate a test input. Then, in step S51, the registers 212 and 213 each having a self-loop included in the block A are replaced with the scan registers 51 and 52, which are connected with each other as a shift register by using the external input pin 201 as a scan-in input, so as to form a scan chain. Also, the register 217 having a self-loop included in the block B is replaced with the scan register 53, which is connected as a shift register by using the external input pin 201 as a scan-in input, so as to form a scan chain. Then, in step S52, the multiplexer 54 for switching the scan-out of each block is generated. In order to switch the scan-out of the blocks A and B. the input of the multiplexer 54 is connected with the outputs of the scan registers 52 and 53, and the output of the multiplexer 54 is connected with the scan-out external output pin 55. The control input of the multiplexer 54 is connected with the isolation controller 56.

In adopting the isolation step S3 of this embodiment, each block is singly testable even when the block is formed with a register having a self-loop identified as a scan register. In addition, regardless of the number of blocks included in the RTL circuit, merely one scan-out external output pin is required, and hence, the number of test input patterns can be decreased.

(Embodiment 6)

A method of design for testability at the RTL according to a sixth embodiment of the invention is characterized by the partitioning step S2 including a process for merging inputs of respective blocks. Specifically, relationship in Teachableness between an input and an output in each block is obtained by extracting a reachable input with regard to each output. On the basis of the obtained relationship, an input of each block whose value can be set through a common external input pin of the RTL circuit is obtained.

Figure 23:
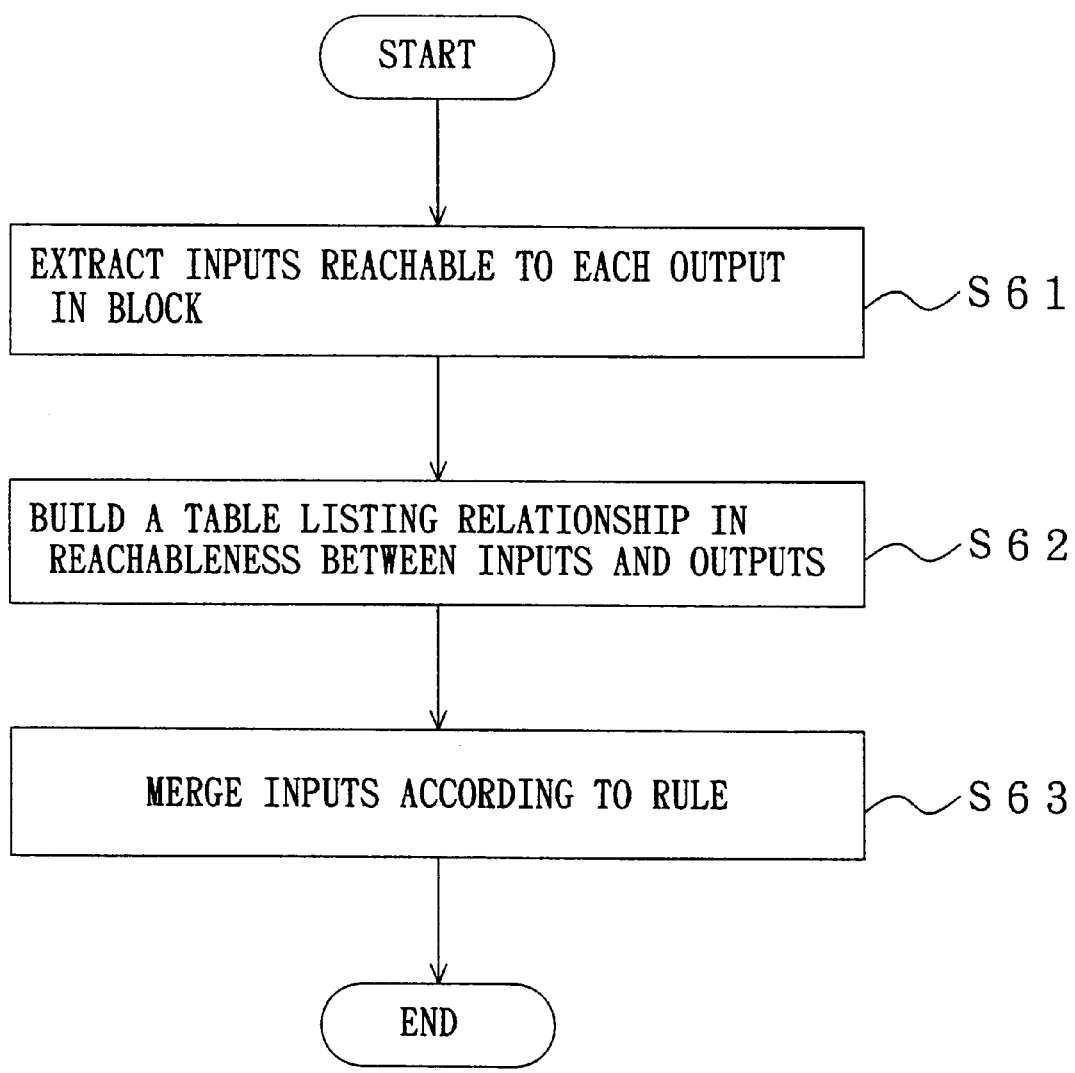
FIG. 23 is a flowchart for showing the procedures of a process for merging inputs of a block in a method of design for testability at the RTL according to a sixth embodiment of the invention.

FIG. 23 is a flowchart for showing the procedures of the process for merging inputs of respective blocks of this embodiment.

In step S61, an input reachable to each output is extracted by searching a path from each output toward the input. In step S62, a table listing the relationship in the reachableness between an input and an output is built. In step S63, the inputs are merged in accordance with a rule described below.

The partitioning step S2 of this embodiment will now be described in more detail with reference to FIGS. 24(*a*) through 24(*c*). FIG. 24(*a*) is a diagram for schematically showing a partitioned block, wherein A, B, C and D denote inputs of the block and $O_1$, $O_2$ and $O_3$ denote outputs of the block. Also, a blank circle indicates a partial circuit corresponding to neither an input nor an output of the block.

In the block shown in FIG. 24(*a*), first in step S61, a path from the output $O_1$ is first searched toward the input, and as a result, the inputs A and B are extracted as the inputs reachable to the output $O_1$. Next, a path from the output $O_2$ is searched toward the input, and as a result, the inputs B and C are extracted as the inputs reachable to the output $O_2$. Then, a path from the output $O_3$ is searched toward the input, and as a result, the inputs C and D are extracted as the inputs reachable to the output $O_3$.

Figures 24A, 24B, 24C:
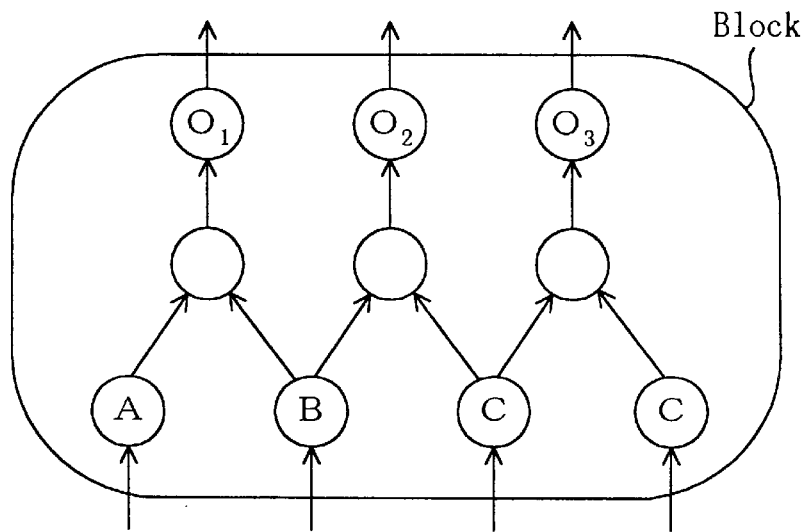

Next, in step S62, a table listing the relationship in the reachableness between the inputs and the outputs is built as is shown in FIG. 24(*b*). In the table shown in FIG. 24(b), ○ indicates an input reachable to an output, and x indicates an input not reachable to an output.

Subsequently in step S63, the inputs of the block are merged in accordance with the following role:

When different inputs have ○ with regard to one output, these inputs are merged; and when different inputs have no ○ with regard to one output, these inputs are not merged.

In accordance with this rule, the inputs A and C are merged and the inputs B and D are merged. As a result, a table as is shown in FIG. 24(c) can be obtained from the table of FIG. 24(b). Thus, this block can be isolated by using two external input pins although the block has four inputs.

Through the aforementioned process, the number of the blocks can be decreased, and the scale of a test circuit for isolating each block can be decreased.

Figure 25:
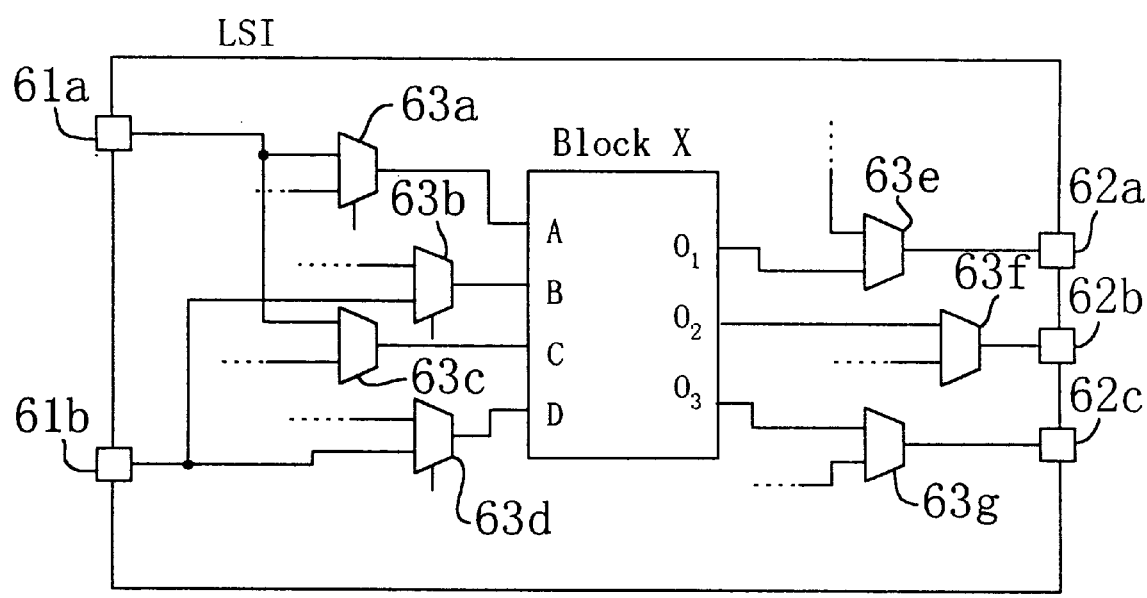
FIG. 25 is a schematic diagram of an LSI designed by the method of design for testability at the RTL of the sixth embodiment of the invention.

FIG. 25 is a schematic diagram of an LSI designed by the method of design for testability of this embodiment. In FIG. 25, a block X corresponds to the block of FIG. 24, reference numerals 61a and 61b denotes external input pins, reference numerals 62a, 62b and 62c denote external output pins, and reference numerals 63a through 63g denote multiplexers inserted for the isolation. As is shown in FIG. 25, among the inputs of the block X, the inputs A and C are isolated by using the external input pin 61a and the multiplexers 63a and 63c, and the inputs B and D are isolated by using the external input pin 61b and the multiplexers 63b and 63d.

The process for merging the inputs of each block of this embodiment can be added, for example, in the partitioning step S2 of the first embodiment shown in FIG. 2, to follow step S21.

(Embodiment 7)

A block is isolated by using a scan chain in this embodiment, while the isolation is attained by using the multiplexers and the external pins in the fourth embodiment.

The isolation step S3 in a method of design for testability at the RTL according to this embodiment will now be specifically described with reference to FIGS. 26(a), 26(b), 27(a) and 27(b).

First, in the case where a register exists on the boundary between blocks, namely, an external input enters a register, and in the case where an external output is output through a register, such a register is replaced with a scan FF.

Figure 26A:
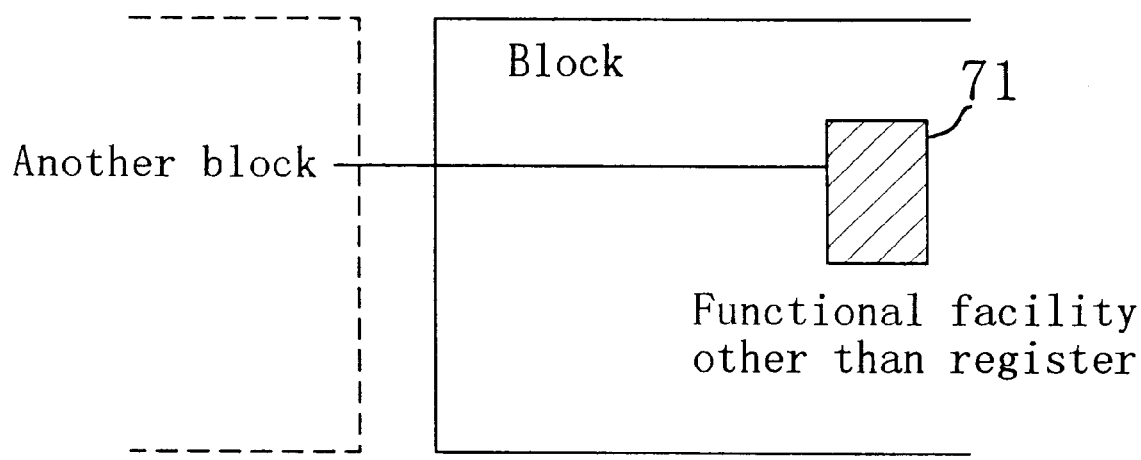
Figure 26B:
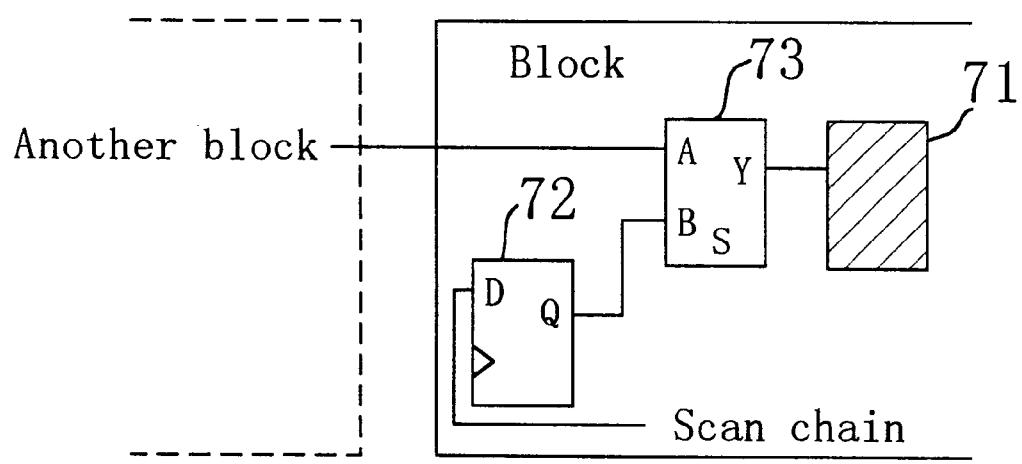
Figure 27A:
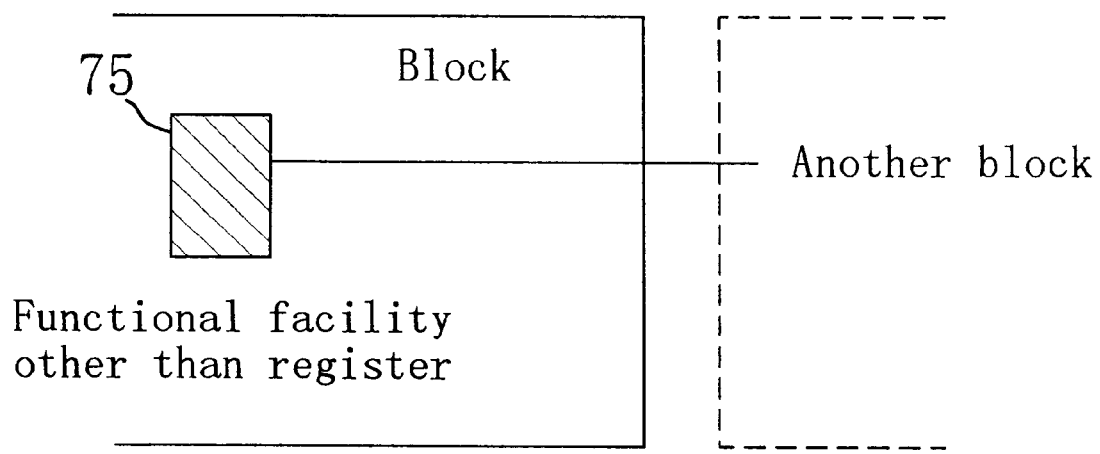
Figure 27B:
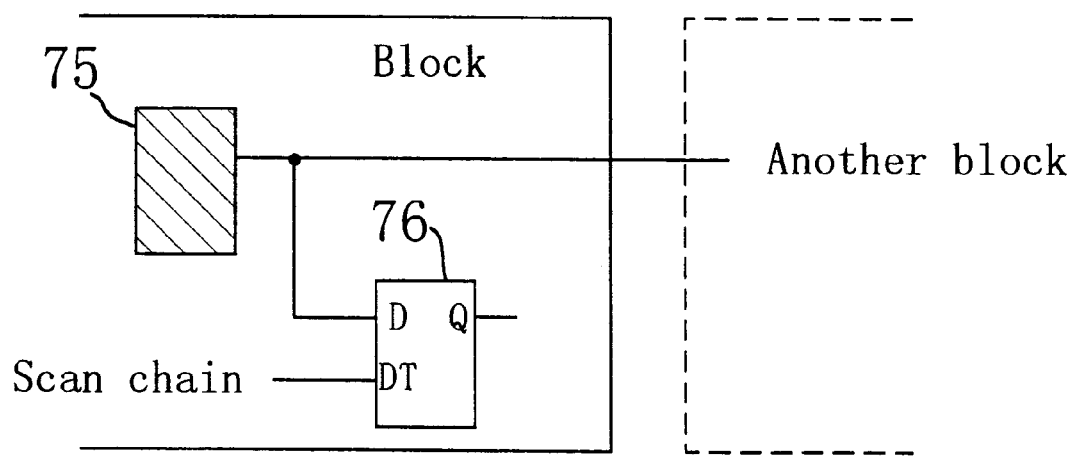

Furthermore, in the case where an external input enters a functional facility 71 other than a register as is shown in FIG. 26(a), a D-latch 72 whose input is connected with a scan chain and a selector 73 are added as is shown in FIG. 26(b). In the case where an external output is output through a functional facility 75 other than a register as is shown in FIG. 27(a), a scan FF 76 is added as is shown in FIG. 27(b).

Figure 28:
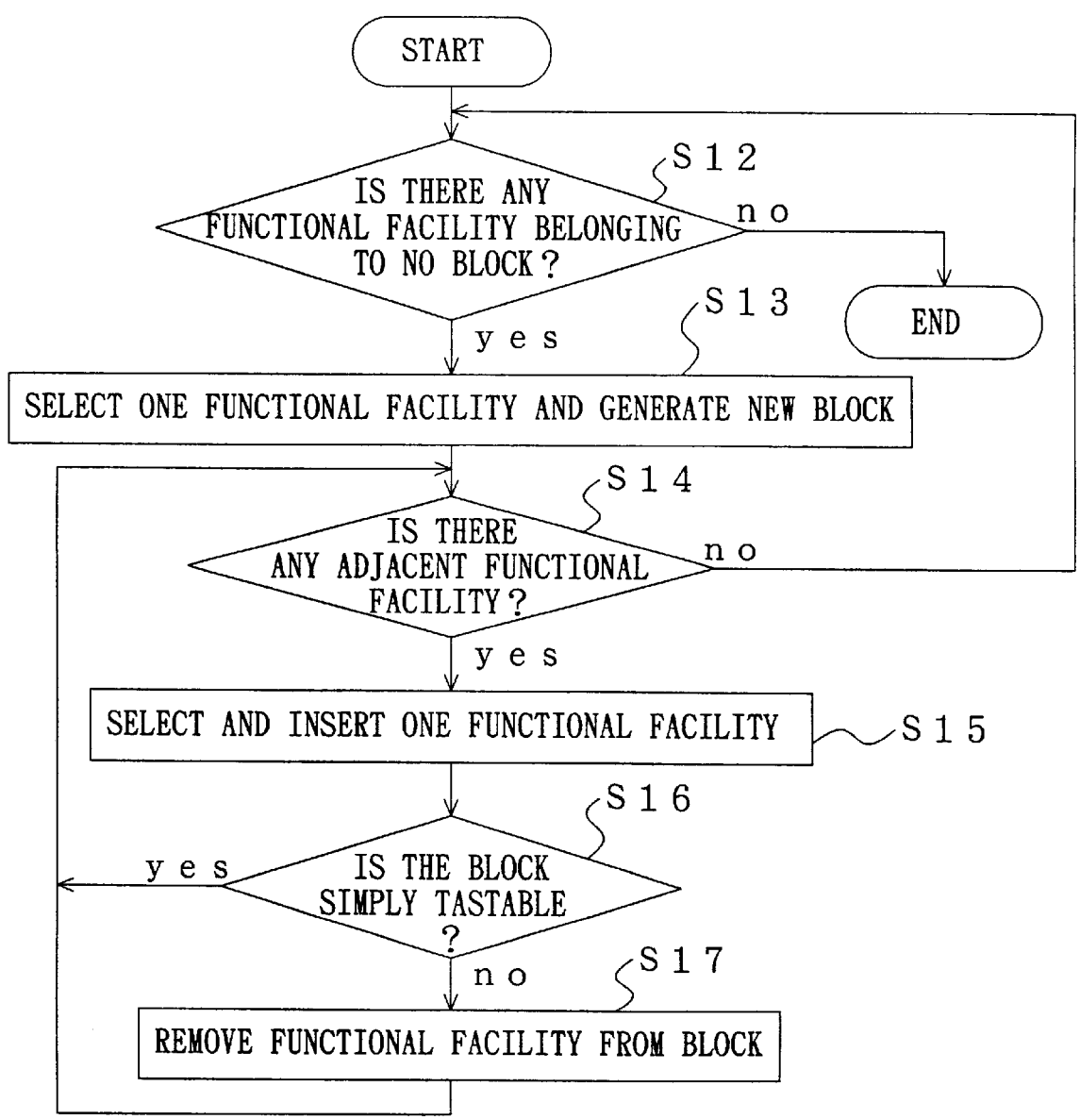
FIG. 28 is a flowchart for showing the procedures of a partitioning step in the method of design for testability at the RTL of the seventh embodiment, namely, the partitioning step adopted when the isolation step of the seventh embodiment follows.

FIG. 28 is a flowchart for showing the procedures of the partitioning step S2 in the method of design for testability at the RTL of this embodiment, namely, the partitioning step S2 adopted on condition that the isolation step S3 of this embodiment follows. The partitioning step S2 of FIG. 28 excludes steps S11, and S18 through S22 from the partitioning step S2 of the first embodiment shown in FIG. 2. By isolating each block by using a scan chain, there is no need to consider the restriction on the input and output numbers of the block in the partitioning step S2. As a result, the number of the blocks can be decreased, thereby decreasing the number of the test circuits.

Figure 29:
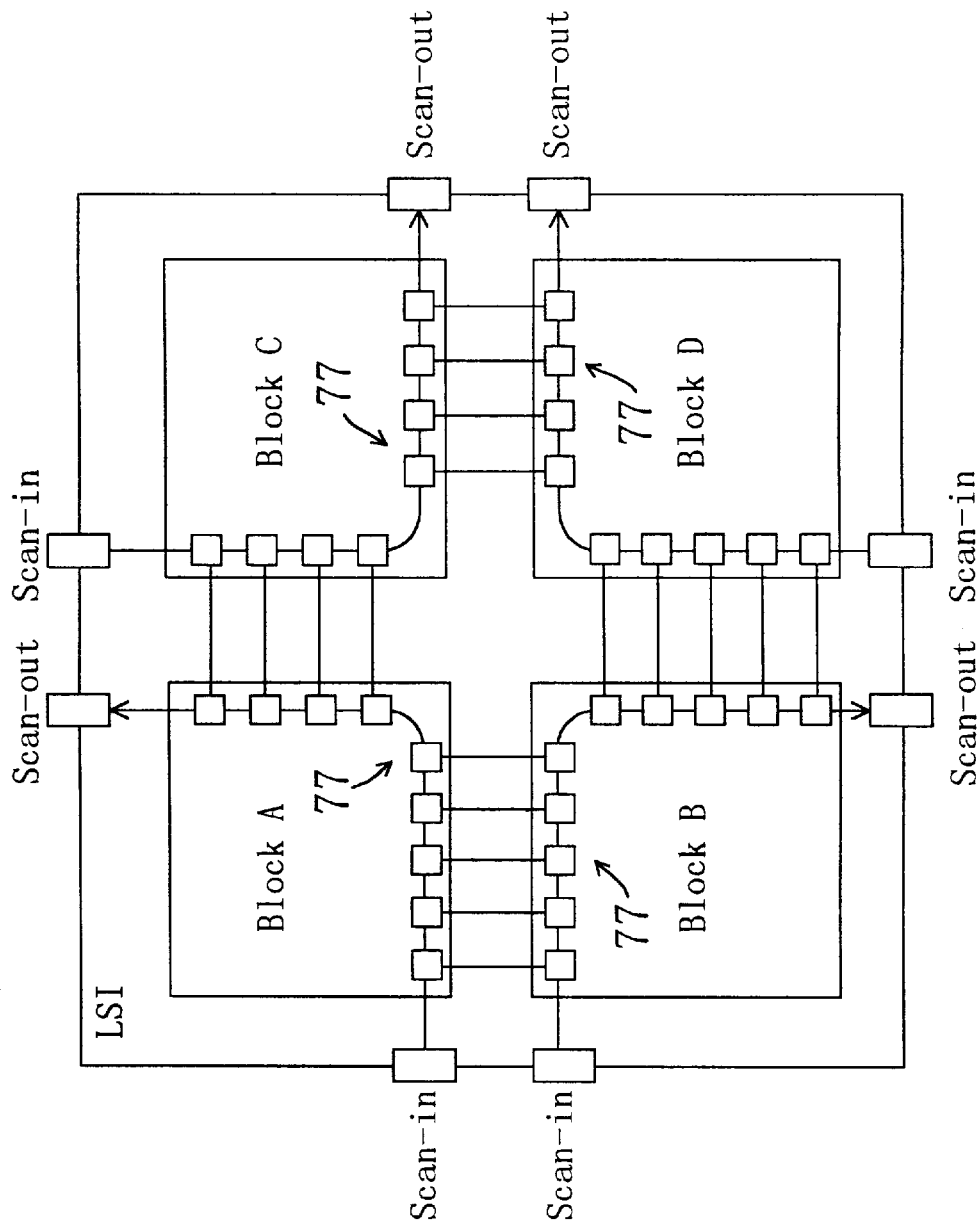
FIG. 29 is a schematic diagram of an LSI designed by the method of design for testability at the RTL according to the seventh embodiment of the invention.

FIG. 29 is a schematic diagram of an LSI designed by the method of design for testability of this embodiment. Each block includes a scan chain 77 so that a test sequence can be generated in each block.

(Embodiment 8)

A method of design for testability at the RTL according to an eighth embodiment of the invention includes, as a preprocessing of the partitioning step S2, a process for partitioning a functional facility having large input and output numbers into plural functional facilities each having small input and output numbers.

Figure 30:
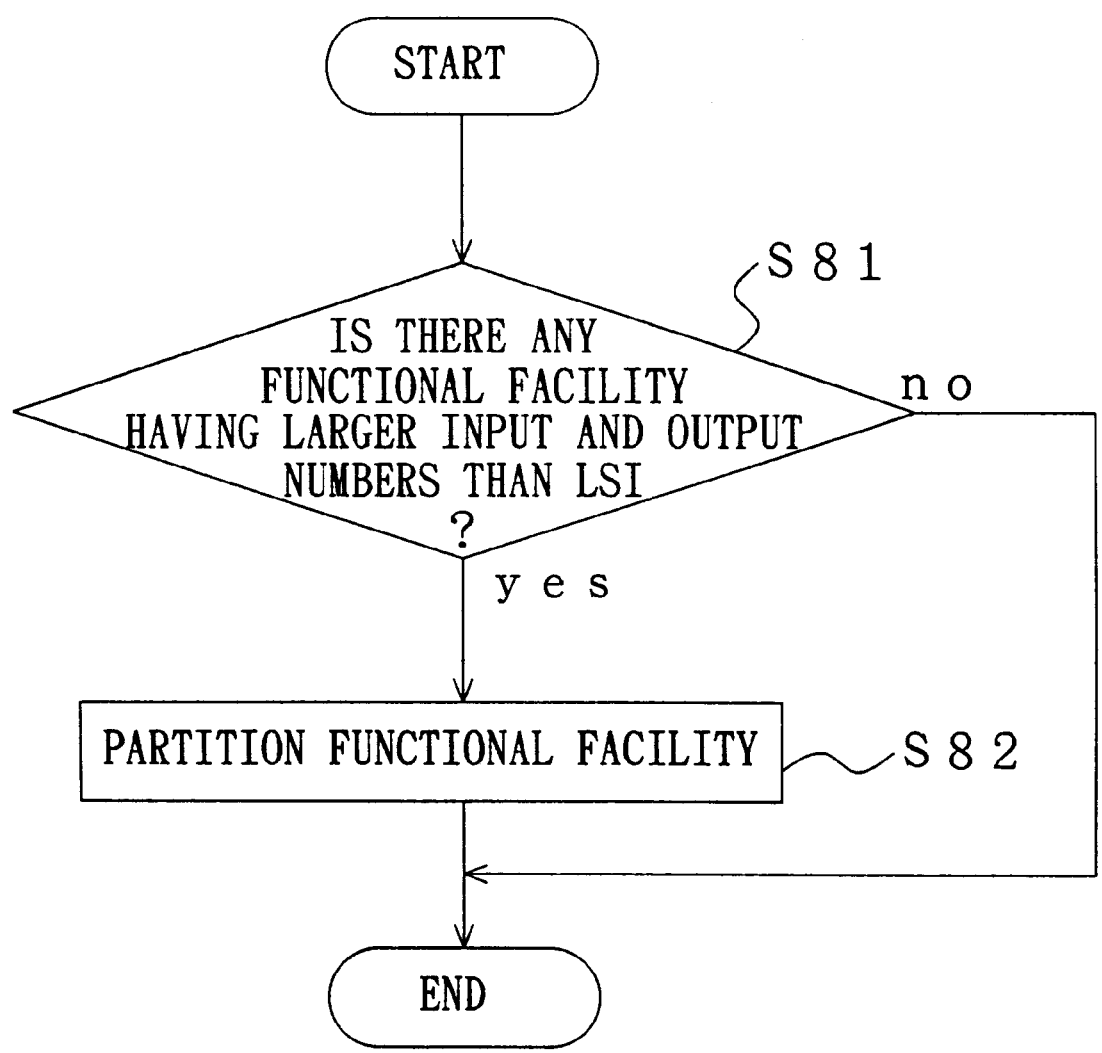
FIG. 30 is a flowchart for showing the procedures of a preprocessing in a method of design for testability at the RTL according to an eighth embodiment of the invention.

FIG. 30 is a flowchart for showing the procedures of the preprocessing of the partitioning step S2 in the method of design for testability at the RTL of this embodiment.

In step S81, it is discriminated whether or not an LSI includes a functional facility having a larger input number or a larger output number than the LSI. When the LSI includes such a functional facility, the procedure proceeds to step S82. In step S82, the functional facility having the larger input or output number than the LSI is converted into an equivalent circuit including plural functional facilities each having a smaller input number and a smaller output number than the LSI.

The preprocessing of the partitioning step S2 of this embodiment will now be specifically described with reference to FIGS. 31(a), 31(b), 32(a) and 32(b).

Figure 31A:
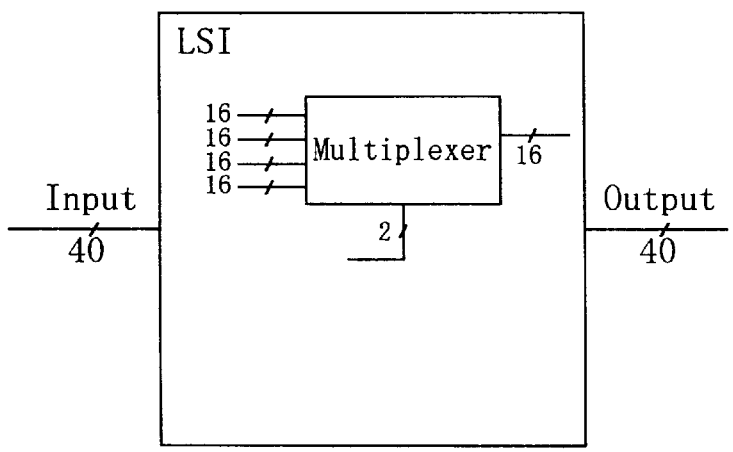
Figure 31B:
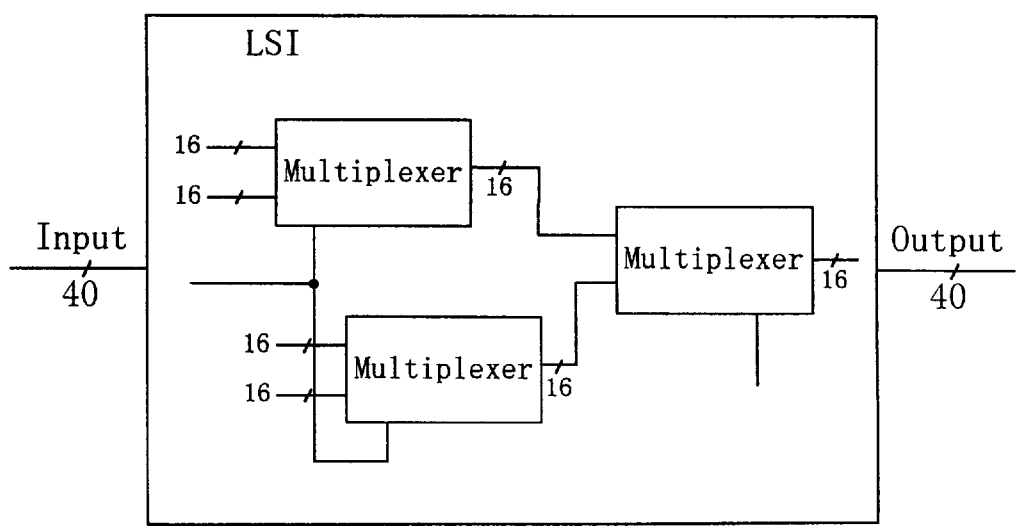

FIG. 31(a) is a diagram of a multiplexer exemplifying a functional facility having a larger input number than the LSI. The multiplexer of FIG. 31(a) has 66 inputs, which exceeds the number of the input pins of the LSI, i.e., 40. Through the preprocessing of this embodiment, the multiplexer of FIG. 31(a) is converted into an equivalent circuit including three multiplexers each having 33 inputs as is shown in FIG. 31(b).

Figure 32A:
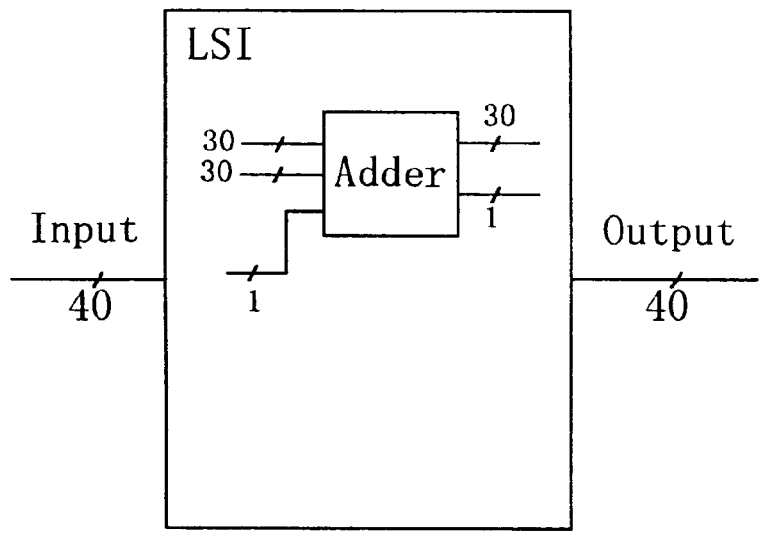
Figure 32B:
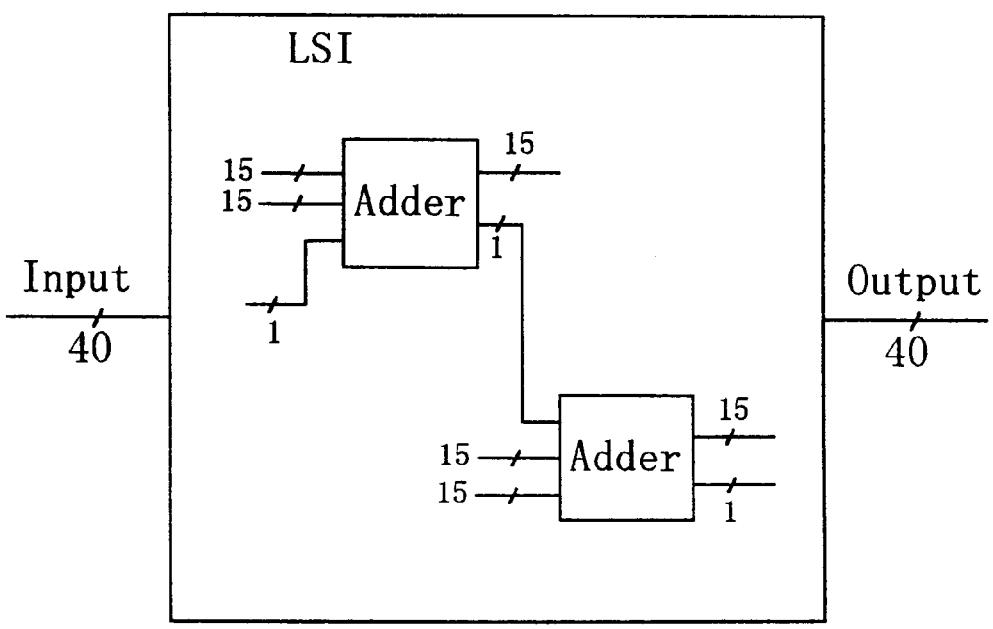

FIG. 32(a) is a diagram of an adder exemplifying a functional facility having a larger input number than the LSI. The adder of FIG. 32(a) has 61 inputs, which exceeds the number of the input pins of the LSI, i.e., 40. Through the preprocessing of this embodiment, the adder of FIG. 32(a) is converted into an equivalent circuit including two adders each having 31 inputs.

By adopting such a preprocessing, a circuit, which has been difficult to be isolated by using multiplexers and external pins, can be isolated in the same manner as another circuit.

(Embodiment 9)

A method of design for testability at the RTL according to a ninth embodiment of the invention includes, as a preprocessing of the partitioning step S2, a process for collecting finite state machines (FSMs), which are functional facilities difficult to be tested when logically designed, in one block.

Figure 33:
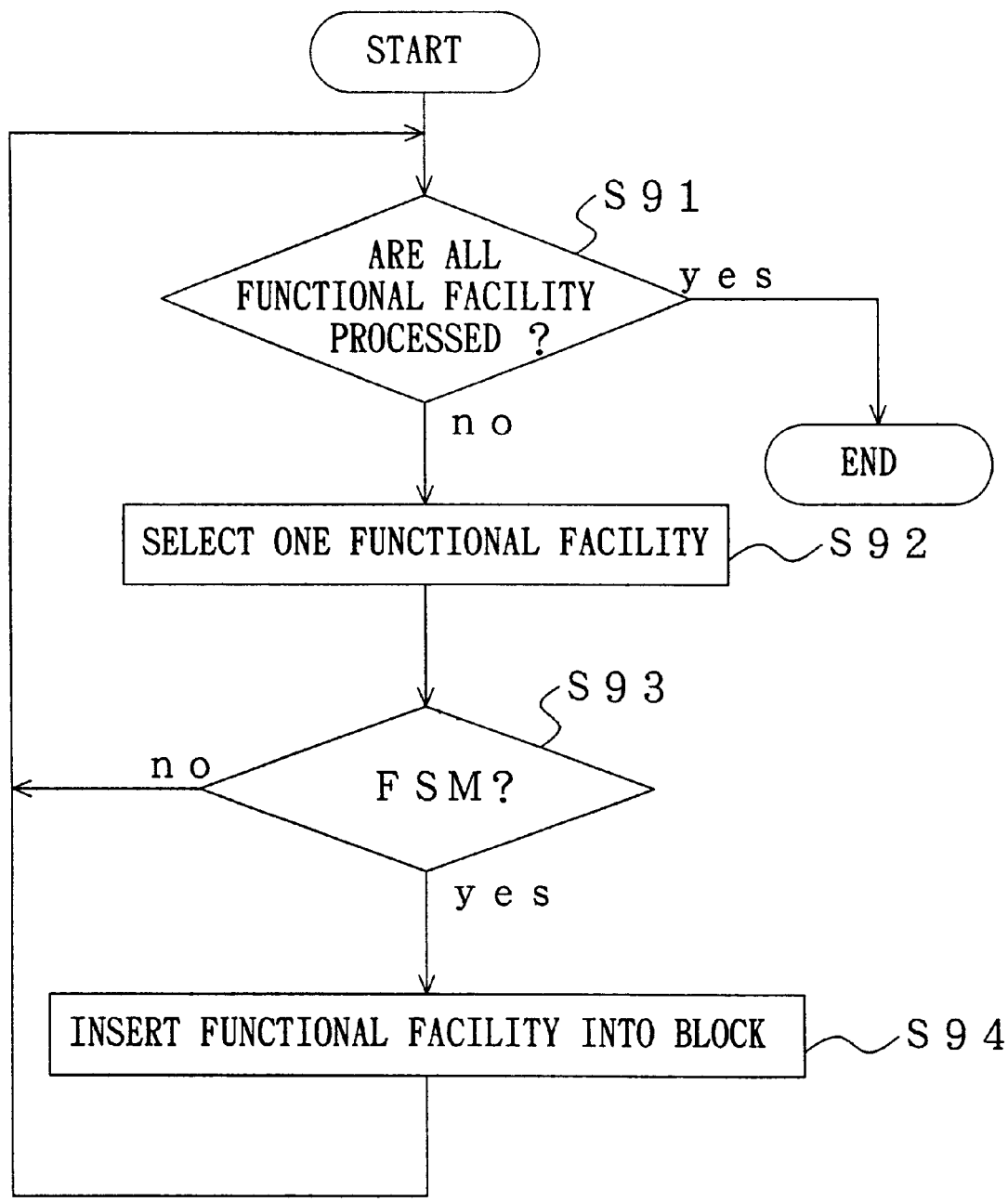
FIG. 33 is a flowchart for showing the procedures of a preprocessing in a method of design for testability at the RTL according to a ninth embodiment of the invention.

FIG. 33 is a flowchart for showing the procedures of the preprocessing of the partitioning step S2 of this embodiment.

In step S91, it is discriminated whether or not the types of all functional facilities included in an RTL circuit have been checked. When the types of all the functional facilities have been checked, the process is completed. When there remains a functional facility whose type has not been checked, the procedure proceeds to step S92.

In step S92, one functional facility whose type has not been checked is selected. Then, in step S93, it is discriminated whether or not the functional facility selected in step S92 is an FSM. When it is an FSM, the procedure proceeds to step S94, and when not, the procedure returns to step S91. In step S94, the FSM is inserted into a specified block.

Figure 34:
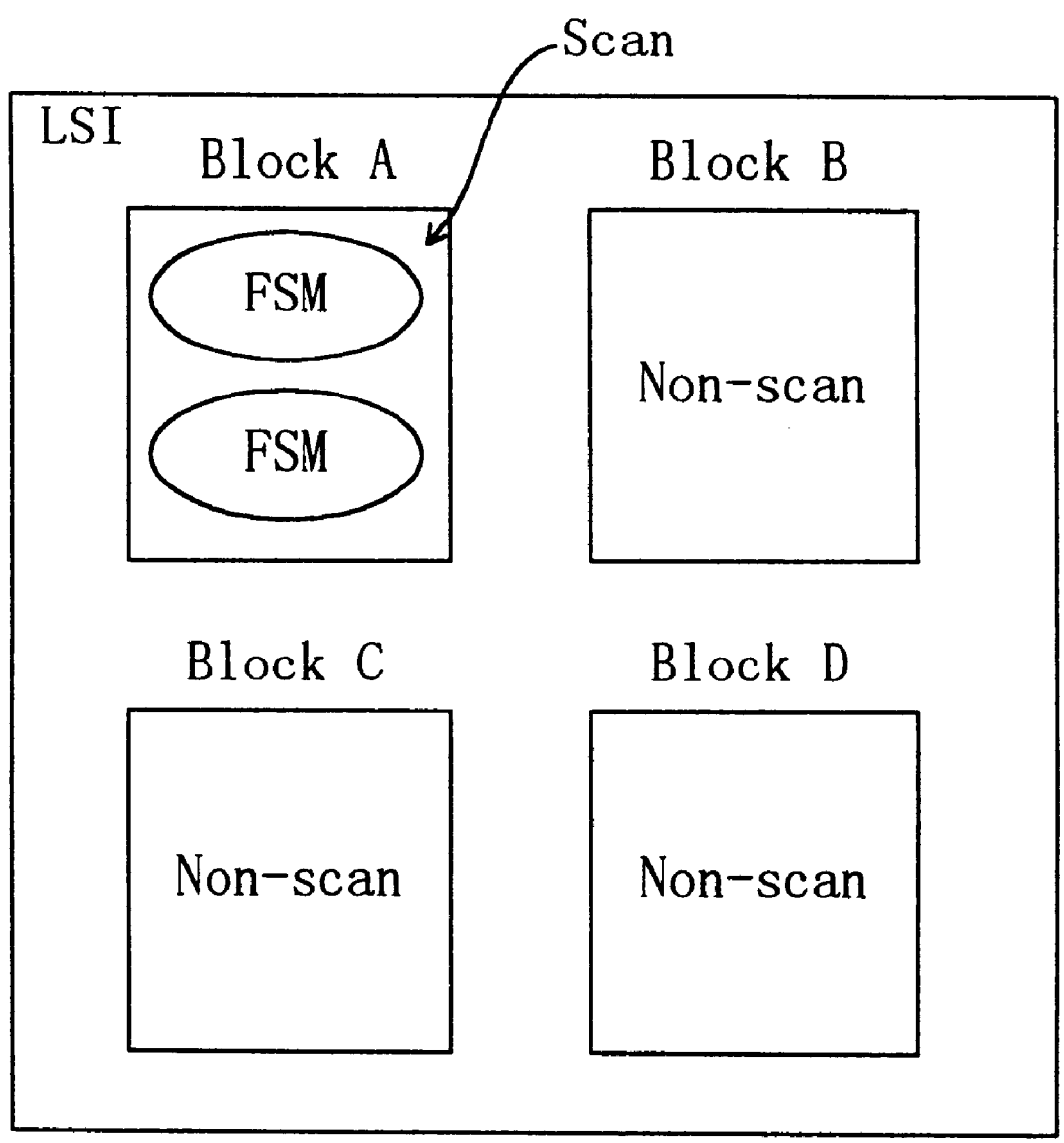
FIG. 34 is a schematic diagram of an LSI designed by the method of design for testability at the RTL of the ninth embodiment.

FIG. 34 is a schematic diagram of an LSI designed by the method of design for testability of this embodiment. The LSI of FIG. 34 has a simply testable configuration in which all the FSMs are collected in a block A, and none of blocks B, C and D includes an FSM.

A circuit realizing an FSM as a logic circuit generally has a loop configuration, which is not simply testable. Therefore, it is necessary to conduct a scan test in a block including the FSMs. Accordingly, when the FSMs are included in various blocks, it is necessary to conduct the scan test in the respective blocks, which can largely elongate a test sequence.

Therefore, when the FSMs are collected in a specific block as in this embodiment, the scan test is required merely in the specific block including the FSMs. Thus, the length of the test sequence can be suppressed from increasing.

What is claimed is:

1. A method of design for testability at a register transfer comprising:

a partitioning step for partitioning an RTL circuit, which is an integrated circuit designed at the register transfer level, into blocks each satisfying a previously defined simply testable condition, and an isolation step for modifying design of said RTL circuit, which has been partitioned into said blocks each satisfying said simply testable condition, thereby making said blocks independently testable, wherein said simply testable condition is that a circuit in each of said blocks has an acyclic structure including no feedback loop and said circuit has a sequential depth not exceeding a predetermined value.

2. The method of design for testability at a register transfer level of claim 1, wherein said isolation step includes:

a first process for generating, in said RTL circuit which has been partitioned into said blocks each satisfying said simply testable condition, an input controlling multiplexer for making an input of each block externally directly controllable and an output observing multiplexer for making an output of each block externally directly observable so as to test each of said blocks independently; and a second process for generating, in said RTL circuit in which said input controlling multiplexer and said output observing multiplexer have been generated in said first process, an isolation controller including a finite state machine for controlling said output observing multiplexer for making said blocks successively testable and a decoder for decoding a content of a register included in said finite state machine.

3. The method of design for testability at a register transfer level of claim 2, wherein said isolation controller generated in said second process controls not only said output observing multiplexer but also said input controlling multiplexer for making said blocks successively testable.

4. The method of design for testability at a register transfer level of claim 2, wherein said partitioning step further includes a process, in partitioning said RTL circuit into said blocks, for identifying a register having a self-loop included in said RTL circuit as a scan register, and said isolation step further includes:

a third process for replacing said register having been identified as a scan register in said process of said partitioning step with a scan register and for forming scan chains by connecting said scan register in each of said blocks; and a fourth process for generating a multiplexer, using scan-out data of said scan chains formed in said third process as an input, for selecting and outputting one of scan-out data of said scan chains.

5. The method of design for testability at a register transfer level of claim 2, wherein said isolation step includes a process for forming, in said RTL circuit having been partitioned into said blocks each satisfying said simply testable condition, a scan chain in each of said blocks, thereby making an input signal controllable and an output signal observable from the outside of said RTL circuit.

6. A method of design for testability at a register transfer level comprising:

a partitioning step for partitioning an RTL circuit, which is an integrated circuit designed at the register transfer level, into blocks each satisfying a previously defined simply testable condition, wherein said simply testable condition is that a circuit in each of said blocks has an acyclic structure including no feedback loop and said circuit has a sequential depth not exceeding a predetermined value.

7. A method of design for testability at a register transfer level comprising:

a partitioning step for partitioning an RTL circuit, which is an integrated circuit designed at the register transfer level, into blocks each satisfying a previously defined simply testable condition, wherein said simply testable condition is that a circuit in each of said blocks has an n-fold line-up structure in which signal paths between an arbitrary register and an arbitrary external output or pseudo-external output have n sorts or less of sequential depths, wherein n is a positive integer.

8. A method of design for testability at a register transfer level comprising:

a partitioning step for partitioning an RTL circuit, which is an integrated circuit designed at the register transfer level, into blocks each satisfying a previously defined simply testable condition, wherein said simply testable condition is that a circuit in each of said blocks has a line-up structure in which each register belongs to merely one time frame obtained through time-axis expansion about an arbitrary external output or pseudo-external output.

9. A method of design for testability at a register transfer level comprising:

a partitioning step for partitioning an RTL circuit, which is an integrated circuit designed at the register transfer level, into blocks each satisfying a previously defined simply testable condition, wherein said simply testable condition is that a circuit in each of said blocks has a line-up structure in which each register belongs to merely one time frame obtained through time-axis expansion about an arbitrary external output or pseudo-external output and said circuit has a sequential depth not exceeding a predetermined value.

10. A method of design for testability at a register transfer level comprising:

a partitioning step for partitioning an RTL circuit, which is an integrated circuit designed at the register transfer level, into blocks each satisfying a previously defined simply testable condition, wherein said simply testable condition is that a circuit in each of said blocks has an acyclic structure including no feedback loop and said circuit has a sequential depth not exceeding a predetermined value and that a circuit in each of said blocks has a combinational test pattern generation complexity.

11. A method of design for testability at a register transfer level comprising:

a partitioning step for partitioning an RTL circuit, which is an integrated circuit designed at the register transfer level, into blocks each satisfying a previously defined simply testable condition, wherein said simply testable condition is that a circuit in each of said blocks has an acyclic structure including no feedback loop and said circuit has a sequential depth not exceeding a predetermined value, wherein said partitioning step includes:
- a first process for selecting, among functional facilities included in said RTL circuit, one functional facility which belongs to none of said blocks, and for generating one block including said selected functional facility;
- a second process for selecting another functional facility, which is adjacent to said block generated in said first process and does not belong to any other blocks, and for inserting said selected functional facility into said generated block; and
- a third process for discriminating whether or not said generated block is simply testable in accordance with said previously defined simply testable condition, and when said generated block is discriminated to be not simply testable, for removing said functional facility inserted in said second process from said generated block.

12. The method of design for testability at a register transfer level of claim 11,
wherein said partitioning step further includes a fourth process for removing, from said generated block, said functional facility inserted into said block in said second process in a reverse order to an inserting order so as to make an input number of the generated block smaller than an input number of the RTL circuit and an output number of the generated block smaller than an output number of the RTL circuit.

13. The method of design for testability at a register transfer level of claim 11,
wherein said second process includes, when there are plural functional facilities which are adjacent to said generated block and do not belong to any other blocks, a process for selecting one functional facility which makes a sum of an input number and an output number of said generated block be minimum on the assumption that said selected functional facility is inserted into said generated block.

14. The method of design for testability at a register transfer level of claim 11,
wherein said partitioning step includes a process for identifying a register having a self-loop and a finite state machine included in said RTL circuit as a scan register.

15. The method of design for testability at a register transfer level of claim 11,
wherein said second process includes, when there remains, in said RTL circuit, no functional facility which is adjacent to said generated block, does not belong to any other blocks and has not been inserted into said generated block for discriminating testability, a process for selecting one functional facility which is not adjacent to said generated block and does not belong to any other blocks, and inserting said selected functional facility into said generated block.

16. A method of design for testability at a register transfer level comprising:
a partitioning step for partitioning an RTL circuit, which is an integrated circuit designed at the register transfer level, into blocks each satisfying a previously defined simply testable condition, wherein said simply testable condition is that a circuit in each of said blocks has an acyclic structure including no feedback loop and said circuit has a sequential depth not exceeding a predetermined value,
said partitioning step includes a process for obtaining relationship on Teachableness between each input and each output of said block by extracting an input reachable to each output, and obtaining a plurality of inputs of said block whose value is controllable through a common external input pin of said RTL circuit on the basis of said relationship.

17. A method of design for testability at a register transfer level comprising:
a partitioning step for partitioning an RTL circuit, which is an integrated circuit designed at the register transfer level, into blocks each satisfying a previously defined simply testable condition, wherein said simply testable condition is that a circuit in each of said blocks has an acyclic structure including no feedback loop and said circuit has a sequential depth not exceeding a predetermined value,
said partitioning step includes, when any functional facilities has a larger input number or larger output number than said RTL circuit, a process for converting said functional facility into an equivalent circuit including functional facilities each having a smaller input number and a smaller output number than said RTL circuit.

18. A method of design for testability at a register transfer level comprising:
a partitioning step for partitioning an RTL circuit, which is an integrated circuit designed at the register transfer level, into blocks each satisfying a previously defined simply testable condition, wherein said simply testable condition is that a circuit in each of said blocks has an acyclic structure including no feedback loop and said circuit has a sequential depth not exceeding a predetermined value,
wherein said partitioning step includes a process for collecting finite state machines included in said RTL circuit in a common block.

19. An integrated circuit, which is partitioned into plural blocks through test simplifying design at a register transfer level, comprising:
- an input controlling multiplexer for making an input signal of each of said blocks directly controllable from the outside of said integrated circuit so as to test each of said blocks independently;
- an output observing multiplexer for making an output signal of each of said blocks directly observable from the outside of said integrated circuit so as to test each of said blocks independently; and
- an isolation controller including a finite state machine for controlling said output observing multiplexer for making said blocks successively testable and a decoder for decoding a content of a register included in said finite state machine,
wherein said integrated circuit is adapted such that a circuit in each of said blocks has an acyclic structure including no feedback loop and said circuit has a sequential depth not exceeding a predetermined value.

20. The integrated circuit of claim 19,
wherein said isolation controller controls not only said output observing multiplexer for making said blocks successively testable but also said input controlling multiplexer.

21. The integrated circuit of claim 19, further comprising:
a scan chain formed in each of said blocks; and
a multiplexer using a scan-out data of said scan chain as an input for selecting and outputting one scan-out data of said scan chain.

22. An integrated circuit, which is partitioned into plural blocks through test simplifying design at a register transfer level and adapted such that a circuit in each of said blocks has an acyclic structure including no feedback loop and said circuit has a sequential depth not exceeding a predetermined value, wherein a plurality of inputs of one block are commonly connected with one external input pin of said integrated circuit.

23. An integrated circuit, which is partitioned into plural blocks through test simplifying design at a register transfer level and adapted such that a circuit in each of said blocks has an acyclic structure including no feedback loop and said circuit has a sequential depth not exceeding a predetermined value, wherein each of said blocks includes a scan chain for making an input signal controllable and an output signal observable from the outside of said integrated circuit.

* * * * *